(12) United States Patent
Clifton et al.

(10) Patent No.: US 8,283,562 B2
(45) Date of Patent: Oct. 9, 2012

(54) ELECTRICAL INTERFACE ASSEMBLY

(75) Inventors: Christopher Clifton, Bloomfield, IN (US); Dean L. Jones, Bloomington, IN (US); Philip S. Mitchell, Springville, IN (US); David Myers, Bloomfield, IN (US); James M. Pruett, Montgomery, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 350 days.

(21) Appl. No.: 12/696,787

(22) Filed: Jan. 29, 2010

(65) Prior Publication Data

US 2011/0155412 A1 Jun. 30, 2011

Related U.S. Application Data

(60) Provisional application No. 61/291,694, filed on Dec. 31, 2009.

(51) Int. Cl.
*H02G 3/18* (2006.01)

(52) U.S. Cl. .............. 174/59; 174/53; 174/57; 174/58; 220/3.2; 220/3.3; 312/300; 312/324; 361/600; 361/724; 361/730; 361/752

(58) Field of Classification Search .............. 174/50, 174/58, 59, 520, 559, 480, 66, 67; 439/535; 248/906; 220/4.02; 333/181–185; 361/600, 361/724, 730, 752; 312/223.1, 223.2, 223.3, 312/223.6
See application file for complete search history.

(56) References Cited

U.S. PATENT DOCUMENTS

| | | | |
|---|---|---|---|
| 1,919,986 A * | 7/1933 | Powers | 312/100 |
| 3,858,091 A | 12/1974 | Wilkinson | |
| 3,960,353 A | 6/1976 | Leutwyler | |
| 4,460,895 A | 7/1984 | Bert et al. | |
| 4,496,057 A | 1/1985 | Zenitani et al. | |
| 4,497,411 A | 2/1985 | DeBortoli | |
| 4,746,263 A | 5/1988 | Cook | |
| 4,792,881 A | 12/1988 | Wilson et al. | |
| 4,802,008 A | 1/1989 | Walling | |
| 4,815,757 A | 3/1989 | Hamilton | |
| 4,871,103 A | 10/1989 | Martinsson | |
| 4,932,176 A | 6/1990 | Roberts et al. | |
| 5,070,429 A | 12/1991 | Skirpan | |

(Continued)

FOREIGN PATENT DOCUMENTS

GB 1 246 538 9/1971

OTHER PUBLICATIONS

The online materials information resource [Online] [retrieved on Mar. 27, 2012] Retrieved from the internet:<http://www.handymanfixhomerepair.com/how-to-replace-electric-outlets/>. Posted online on Sep. 15, 2009.*

(Continued)

*Primary Examiner* — Jinhee Lee
*Assistant Examiner* — Binh Tran
(74) *Attorney, Agent, or Firm* — Christopher A. Monsey

(57) ABSTRACT

An electrical interface assembly configured to be supported within a wall of a mobile structure. The electrical interface assembly includes a frame having spaced apart inner and outer supports. Panels including electrical connectors are removably supported by the inner and outer supports.

20 Claims, 24 Drawing Sheets

U.S. PATENT DOCUMENTS

| | | | |
|---|---|---|---|
| 5,229,925 | A | 7/1993 | Spencer et al. |
| 5,239,129 | A | 8/1993 | Ehrenfels |
| 5,272,279 | A | 12/1993 | Filshie |
| 5,304,964 | A * | 4/1994 | DiMarco ...................... 333/181 |
| 5,328,260 | A | 7/1994 | Beirise |
| 5,366,071 | A | 11/1994 | Laszlo |
| 5,572,837 | A | 11/1996 | Featherstone et al. |
| 5,615,855 | A | 4/1997 | Marue et al. |
| 5,683,001 | A | 11/1997 | Masuda et al. |
| 5,721,394 | A | 2/1998 | Mulks |
| 5,743,635 | A | 4/1998 | Hulse et al. |
| 5,778,612 | A | 7/1998 | Kissinger et al. |
| 5,794,794 | A | 8/1998 | Hull |
| 5,819,956 | A | 10/1998 | Rinderer |
| 5,921,402 | A | 7/1999 | Magenheimer |
| 6,152,048 | A | 11/2000 | Vander Park |
| 6,201,687 | B1 | 3/2001 | Murray |
| 6,253,502 | B1 | 7/2001 | Layton |
| 6,260,310 | B1 | 7/2001 | Price et al. |
| 6,347,963 | B1 | 2/2002 | Falkenberg et al. |
| 6,466,431 | B1 | 10/2002 | Thomas |
| 6,497,442 | B1 | 12/2002 | Wacker |
| 6,546,677 | B1 | 4/2003 | Featherstone |
| 6,796,438 | B2 | 9/2004 | Mendoza |
| 6,964,463 | B1 | 11/2005 | Hindle et al. |
| 7,000,357 | B1 | 2/2006 | Stearns et al. |
| 7,017,760 | B2 | 3/2006 | Zuclich et al. |
| 7,045,706 | B1 | 5/2006 | Lincoln, III et al. |
| 7,080,865 | B2 | 7/2006 | Bergeron et al. |
| 7,265,292 | B2 | 9/2007 | Greenfield |
| 7,462,777 | B2 | 12/2008 | Dinh |
| 7,479,598 | B1 * | 1/2009 | Shotey et al. ................... 174/58 |
| 7,585,191 | B2 * | 9/2009 | Hawley et al. ................ 439/676 |
| 2007/0102180 | A1 | 5/2007 | Brosig-Rodriguez et al. |
| 2008/0258931 | A1 | 10/2008 | Christensen et al. |

OTHER PUBLICATIONS

Antenna Products PM Mast Series—"Telescopic Masts", retrieved from: http://www.antennaproducts.com/telmasts.pdf., pp. 42 and 43, Mineral Wells, TX.

ArmyProperty.com, "Quick Erect Antenna Mast System (QEAM)," retrieved from http://www.armyproperty.com/Equipment-Info/QEAM.htm on Nov. 2, 2009, 4 pgs.

Clark Masts Fast Erecting Mast Systems, "Mast Mounting," retrieved from http://www.clarkmasts.com/mast_mounting.php on Oct. 31, 2009, 1 pg.

Floatograph Technologies, "Commercial Telescoping Masts," ©2008, retrieved from http://www.telescopingmast.com on Nov. 2, 2009, 24 pgs.

Trival Antene d.o.o., "Telecopic Winch Driven Masts STV," retrieved from http://www.trival-antennas-masts.com, 4 pgs., Kamnik, Solvenia.

Wenzlau Engineering, "Will-Burt Quick Erecting Antenna Masts," retrieved from http://www.wenzlau.com/masts-qeam.htm on Oct. 31, 2009, 2 pgs., Pasadena, CA.

The Will-Burt Company, "Mast Installation Guide for External Mounting," at least as early as Nov. 2, 2009, p. 1, sheet 412 and p. 18.

* cited by examiner

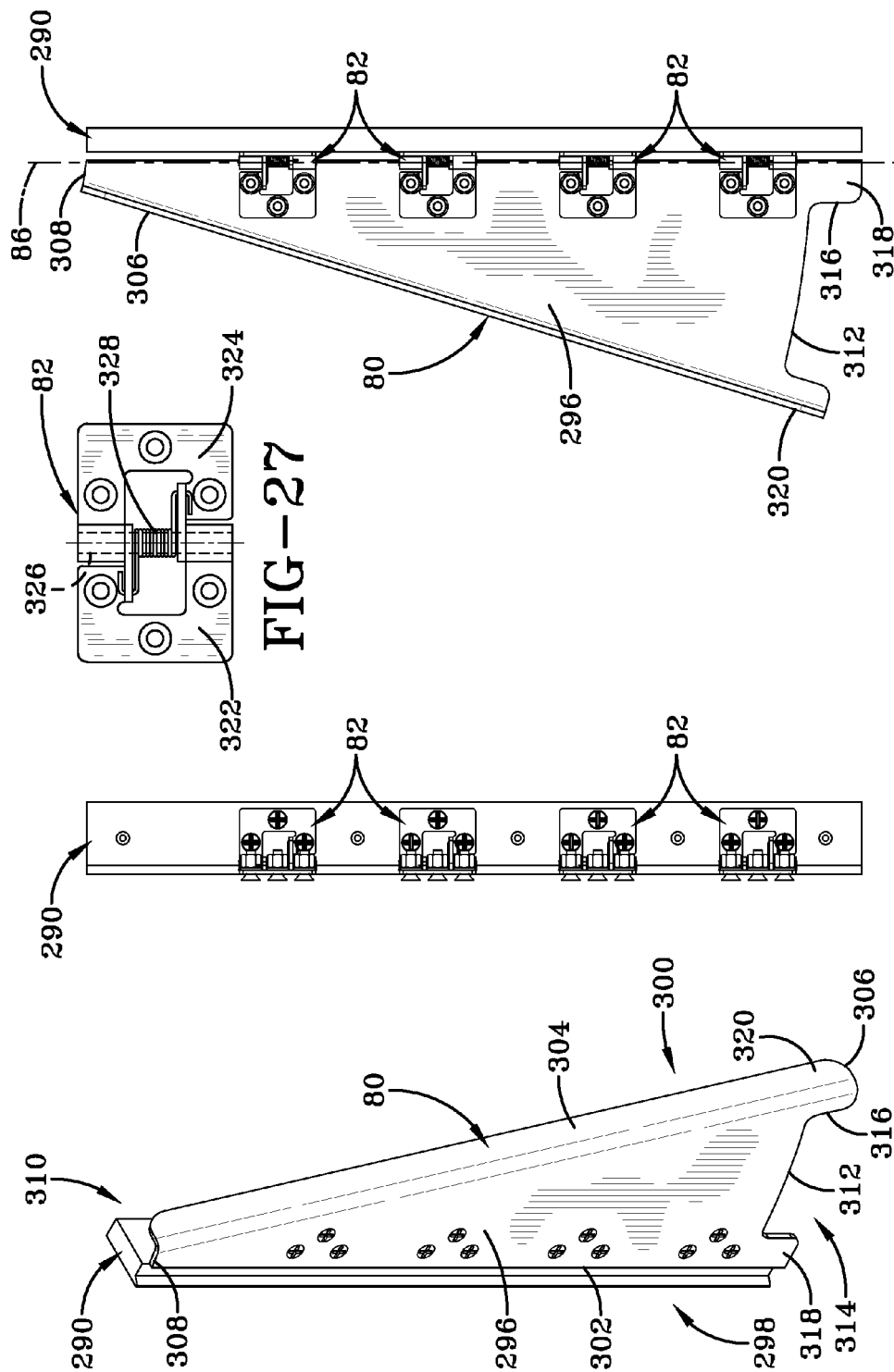

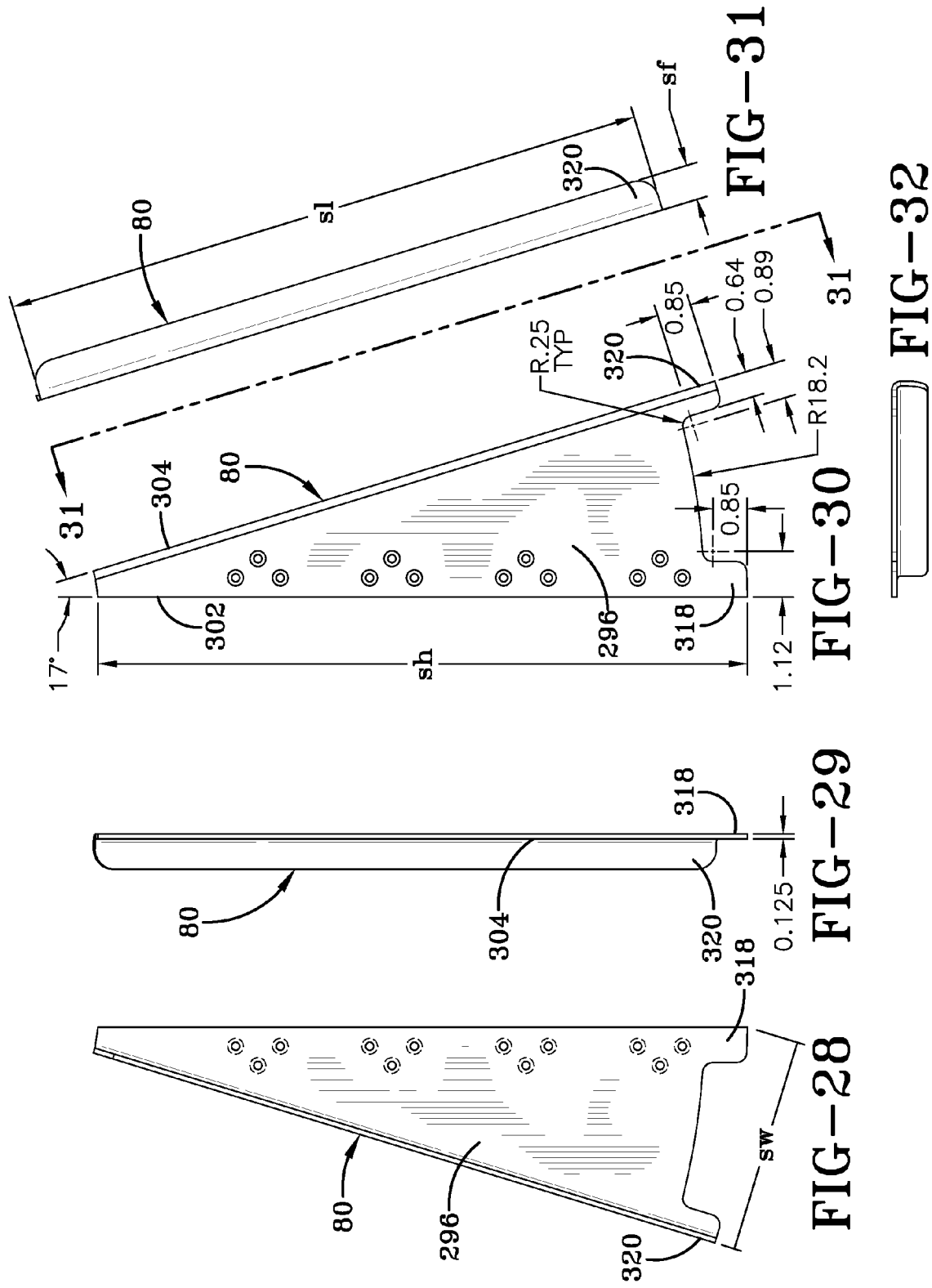

ELECTRICAL INTERFACE ASSEMBLY

CROSS-REFERENCE TO RELATED APPLICATIONS

The present application claims priority as a continuation-in-part application to U.S. Provisional Patent Application Ser. No. 61/291,694, filed Dec. 31, 2009, entitled "VEHICLE AND MAST MOUNTING ASSEMBLY THEREFOR," the disclosure of which is expressly incorporated by reference herein. The present application is also related to U.S. patent application Ser. No. 12/696,778, filed Jan. 29, 2010, entitled "PROTECTIVE MEMBERS FOR AN ELECTRICAL INTERFACE ASSEMBLY", and U.S. patent application Ser. No. 12/696,861, filed Jan. 29, 2010, entitled "COMMUNICATIONS VEHICLE", the disclosures of which are expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon.

BACKGROUND AND SUMMARY OF THE DISCLOSURE

The present invention relates generally to electrical interface assemblies and, more particularly, to interface assemblies including modular panels and configured to be supported within the wall of a mobile structure.

It is known to provide mobile communication structures including a plurality of external electrical interfaces, such as signal entry panels. Such signal entry panels are often uncovered and thereby exposed to environmental elements, such as rain, snow, soil, sand, and debris. Such exposure may interfere with the operation of the signal entry panels by disrupting with electrical connections therewith and causing intermittent failures. Furthermore, it is often desired to quickly modify the number and/or types of electrical connections supported by the signal entry panels, often in remote locations.

According to an illustrative embodiment of the present disclosure, an electrical interface assembly is configured to be supported within a wall of a mobile structure. The electrical interface assembly includes a frame having an outer support and an inner support spaced apart from the outer support. A chamber extends between the outer support and the inner support and is configured to be positioned within the wall of the mobile structure. An exterior panel is supported by the outer support and includes at least one electrical connector. A plurality of couplers removably couple the exterior panel to the outer support. An outer electromagnetic interference gasket is positioned intermediate the exterior panel and the outer support. An interior panel is supported by the inner support and includes at least one electrical connector. A plurality of couplers removably couple the interior panel to the inner support. An inner electromagnetic interference gasket is positioned intermediate the interior panel and the inner support. A cable is electrically coupled intermediate the at least one electrical connector of the exterior panel and the at least one electrical connector of the interior panel.

According to another illustrative embodiment of the present disclosure, a method of installing a signal entry panel includes the steps of providing a support having an outer support and an inner support spaced apart from the outer support. The method further includes the steps of positioning an electromagnetic interference gasket adjacent the outer support, and positioning an outer signal entry panel adjacent the outer support with the electromagnetic interference gasket intermediate the signal entry panel and the outer support, the outer signal entry panel including at least one electrical connector. The method further includes the steps of securing a plurality of couplers to the signal entry panel for releasably coupling the signal entry panel to the outer support, positioning an inner signal entry panel adjacent the inner support, the inner signal entry panel including at least one electrical connector, and electrically coupling the outer signal entry panel with the inner signal entry panel.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The foregoing aspects and many of the attendant advantages of this invention will become more readily appreciated as the same become better understood by reference to the following detailed description when taken in conjunction with the accompanying drawings.

FIG. 24 is a perspective view of a side wing of the electrical interface assembly of FIG. 3;

FIG. 25 is an end view of the side wing of FIG. 24;

FIG. 26 is a side elevational view of the side wing of FIG. 24;

FIG. 27 is a detail view of a side wing hinge of FIG. 24;

FIG. 28 is a first side elevational view of a side wing body of FIG. 24;

FIG. 29 is a first end view of the side wing body of FIG. 28;

FIG. 30 is a second side elevational view of the side wing body of FIG. 28;

FIG. 31 is a second end view of the side wing body of FIG. 28, taken along line 31-31 of FIG. 30;

FIG. 32 is a bottom plan view of the side wing body of FIG. 30;

Figure 1:
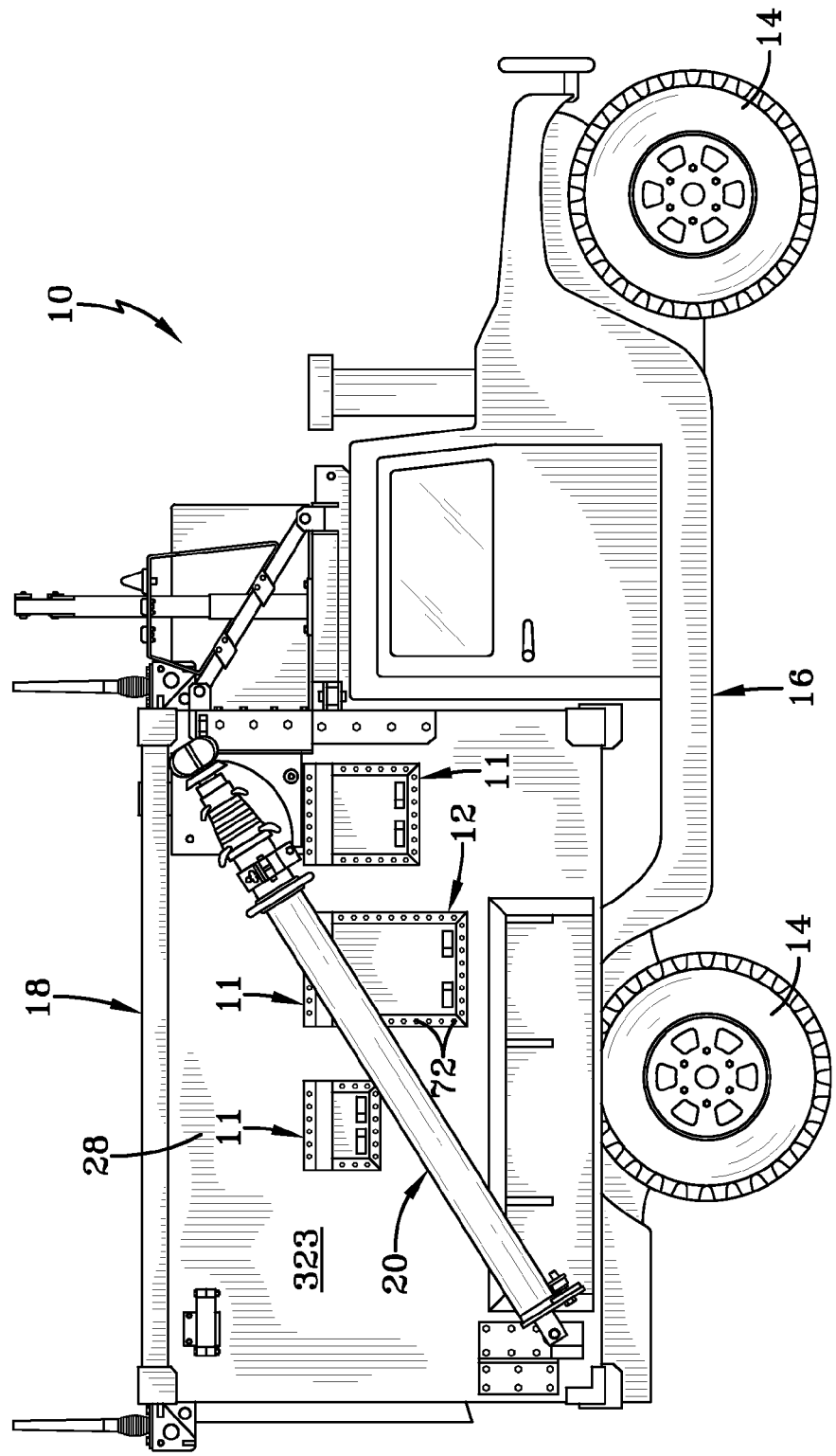
FIG. 1 is a side view of a vehicle including an illustrative electrical interface assembly of the present disclosure.

Corresponding reference characters indicate corresponding parts throughout the several views. Although the drawings represent embodiments of various features and components according to the present disclosure, the drawings are not necessarily to scale and certain features may be exaggerated in order to better illustrate and explain the present disclosure. The exemplification set out herein illustrates embodiments of the invention, and such exemplifications are not to be construed as limiting the scope of the invention in any manner.

DETAILED DESCRIPTION OF THE DRAWINGS

For the purposes of promoting an understanding of the principles of the invention, reference will now be made to the embodiments illustrated in the drawings, which are described below. The embodiments disclosed below are not intended to be exhaustive or limit the invention to the precise form disclosed in the following detailed description. Rather, the embodiments are chosen and described so that others skilled in the art may utilize their teachings. It will be understood that no limitation of the scope of the invention is thereby intended. The invention includes any alterations and further modifications in the illustrated devices and described methods and further applications of the principles of the invention which would normally occur to one skilled in the art to which the invention relates.

Figure 2:
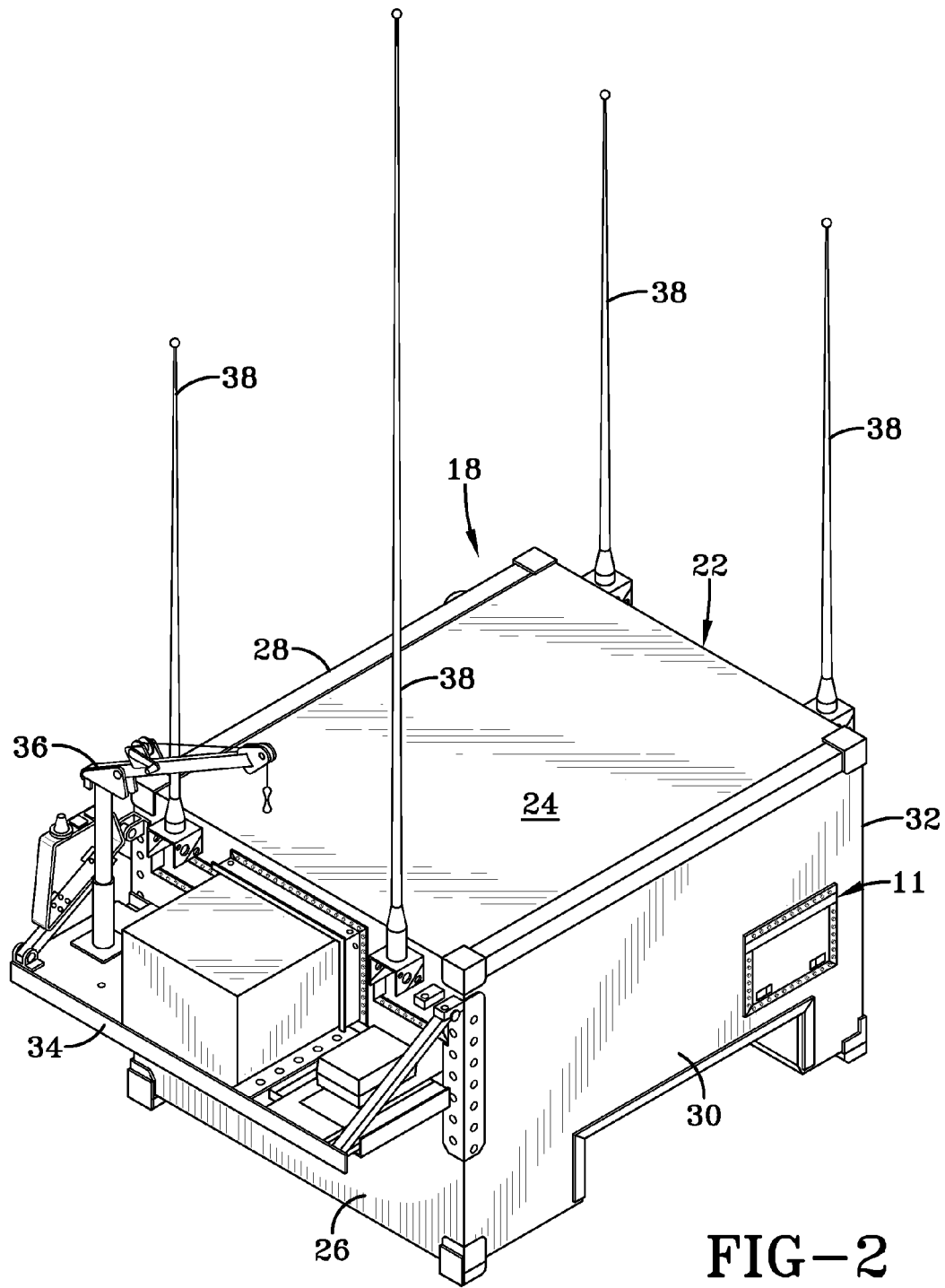
FIG. 2 is a perspective view of the shelter assembly carried by the vehicle of FIG. 1.

Referring initially to FIGS. 1 and 2, a mobile structure, illustratively a vehicle 10, is shown as including a plurality of electrical interface assemblies 11. The vehicle 10 illustratively includes a plurality of ground engaging members 14 which support a frame 16. While the ground engaging members 14 are shown as comprising tires and wheels, other ground engaging members such as tracks or sleds may be employed. The invention is equally applicable to a wide variety of mobile structures (e.g., water floatation devices) as well as fixed structures (e.g., buildings).

In the illustrative embodiment, a shelter assembly 18 is supported by the frame 16 and includes a pivotally mounted mast assembly 20. The mast assembly 20 may support various antennae for transmitting and receiving radio frequency signals. Additional details of the mast assembly 20 are provided in U.S. Provisional Patent Application Ser. No. 61/291,694, filed Dec. 31, 2009, entitled "VEHICLE AND MAST MOUNTING ASSEMBLY THEREFOR," the disclosure of which has been expressly incorporated by reference herein.

Referring further to FIG. 2, the shelter assembly 18 illustratively includes an enclosure 22 having a top wall 24, a front wall 26, side walls 28 and 30, and a rear wall 32. Shelter assembly 18 may also include a work platform 34 including a hoist 36, as well as a plurality of antenna 38 positioned around the enclosure 22. A plurality of electrical interface assemblies 11 may be supported within one or more of the walls 26, 28, 30, and 32 of the enclosure 22.

Figure 3:
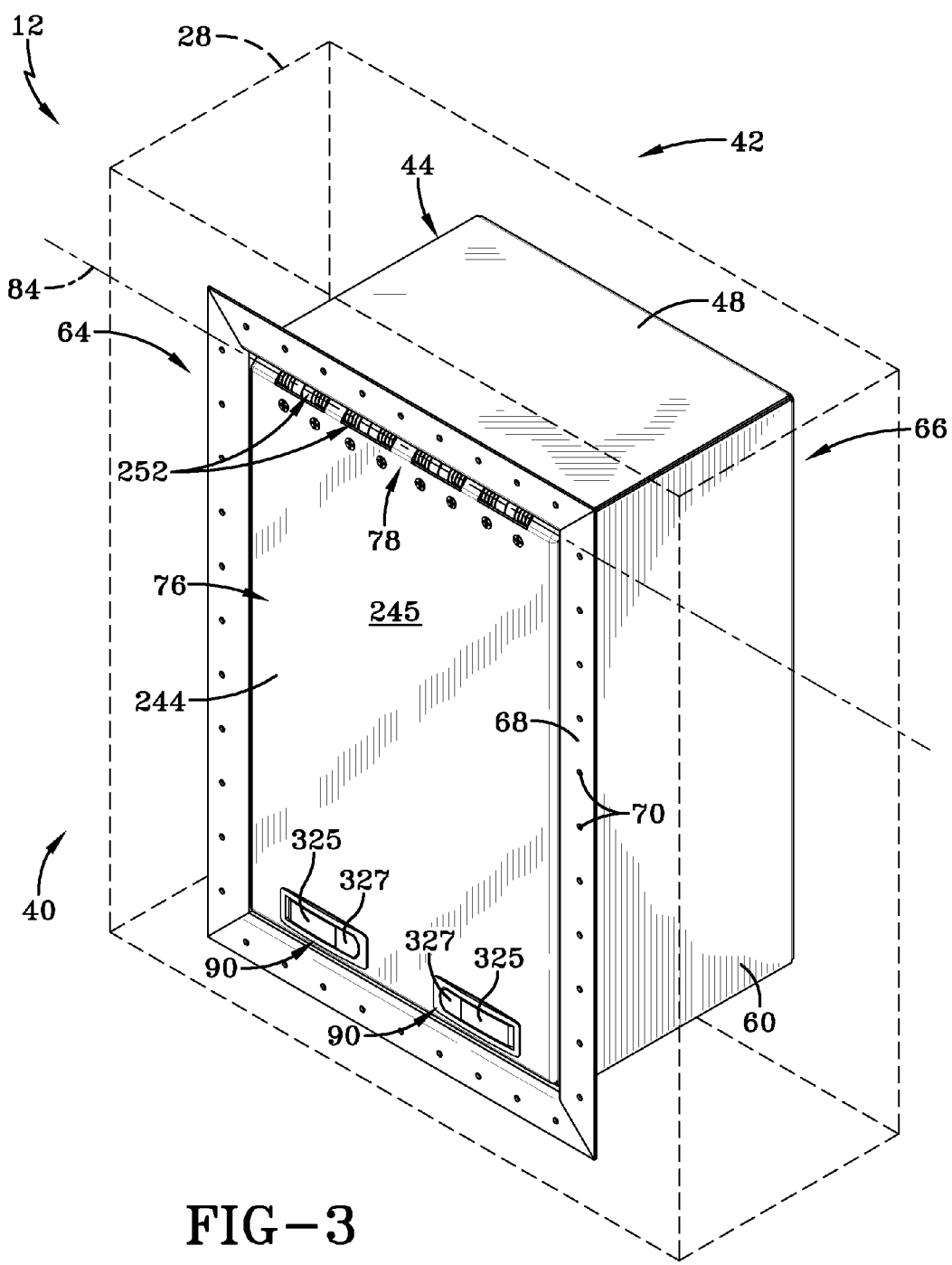
FIG. 3 is a perspective view of the illustrative electrical interface assembly shown in FIG. 1.

With reference to FIGS. 3-8, an illustrative electrical interface assembly 11, such as a signal interface assembly 12, is shown removed from the enclosure 22. The signal interface assembly 12 is illustratively configured to provide for simple and efficient electrical communication between an exterior 40 of the enclosure 22 and an interior 42 of the enclosure 22 (FIG. 3). More particularly, the signal interface assembly 12 permits electrical communication between equipment external to the enclosure 22 and equipment received within the enclosure 22. Such electrical communication may be user defined, and illustratively may include telecommunication signals (e.g. radio frequency signals and data transmissions), electrical power transmissions, etc. As indicated above, the signal interface assembly 12 may be positioned within a vertical support structure, such as vertical wall 26, 28, 30, 32 of the enclosure 22 (FIG. 2).

Figure 4:
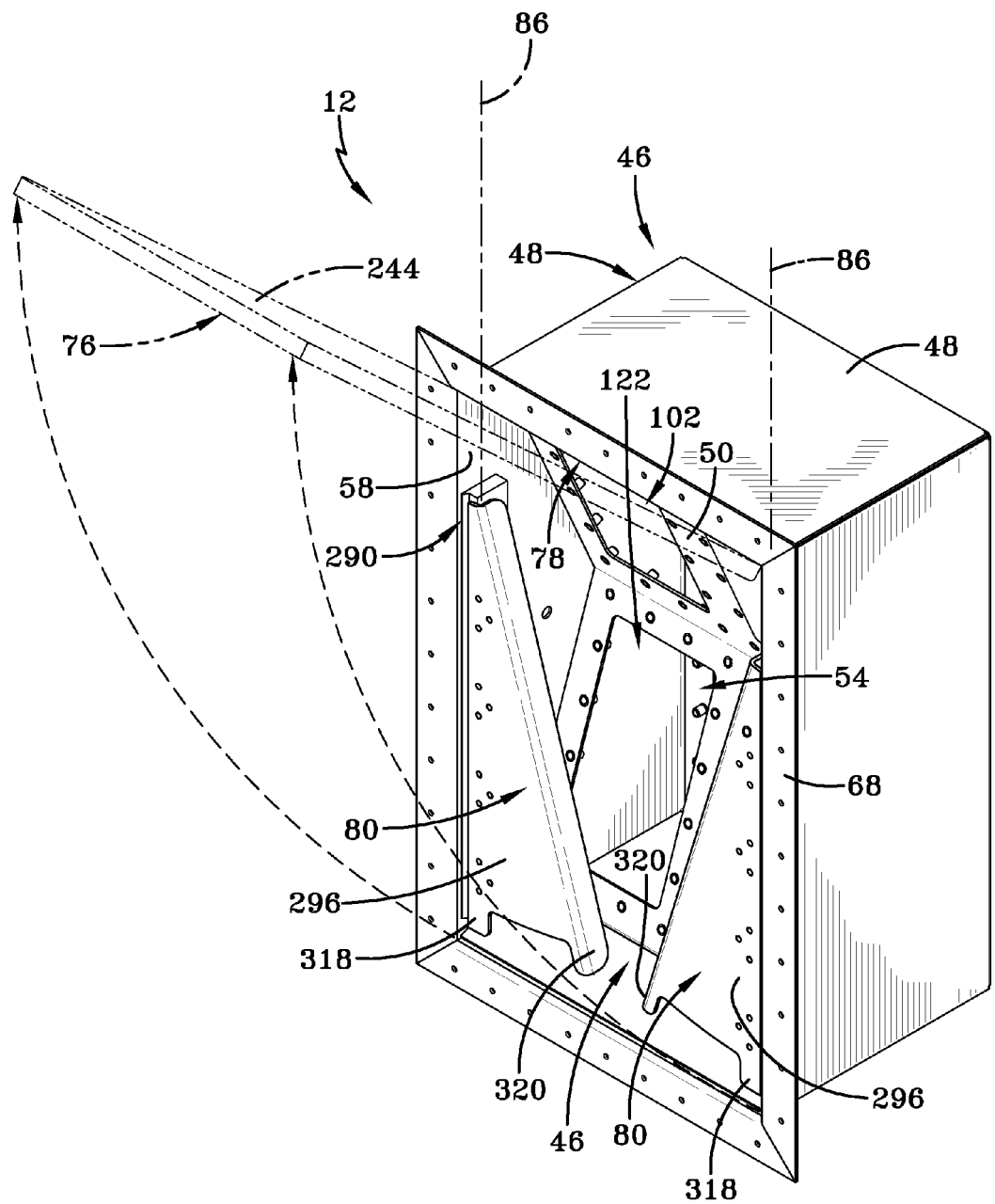
FIG. 4 is a view similar to FIG. 3 of the electrical interface assembly, with the cover shown in phantom in a fully raised position, the side wings shown in a stowed position, and the interface panels removed for clarity.
Figure 5:
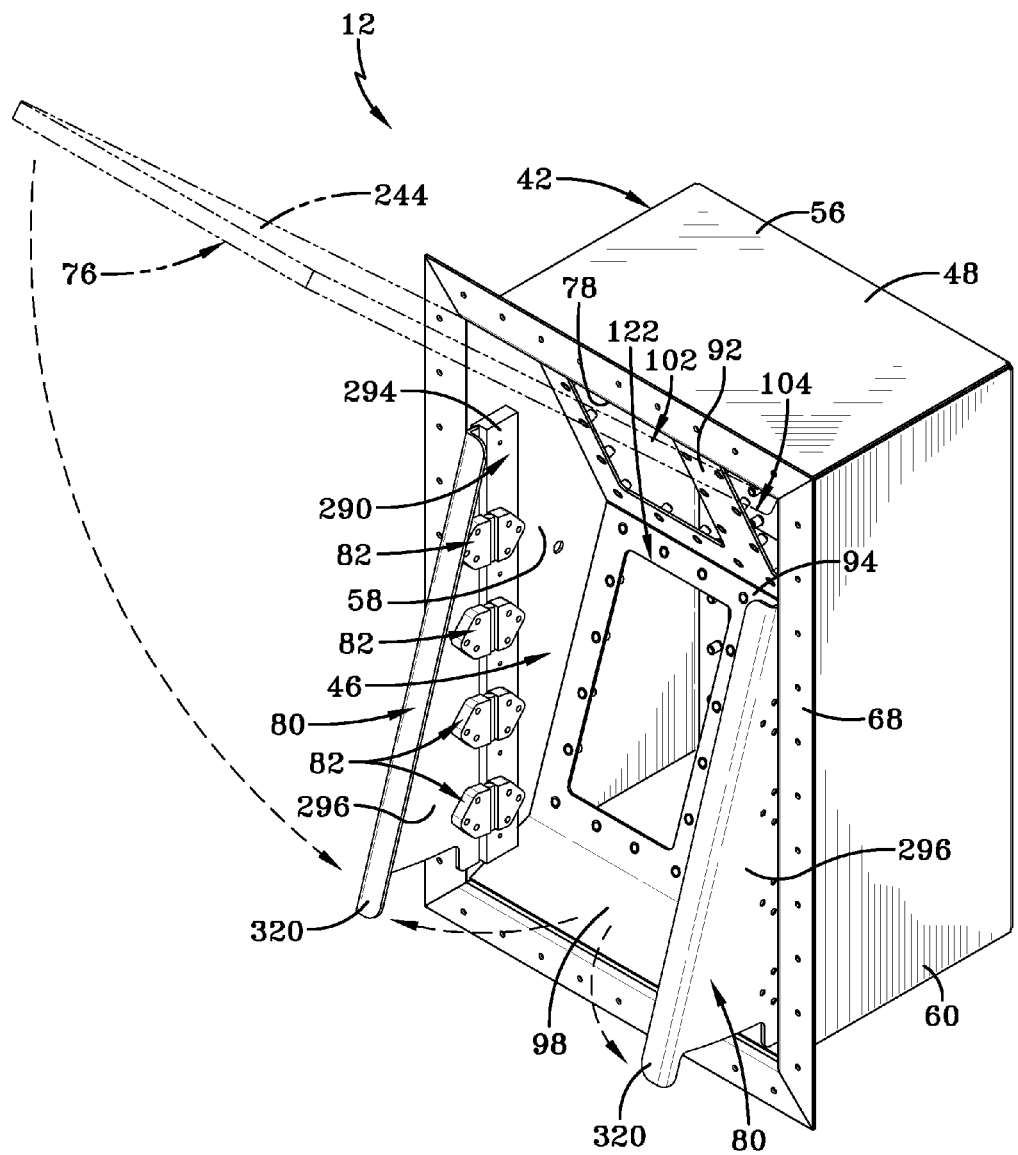
FIG. 5 is a view similar to FIG. 4, showing the side wings shown in a deployed position.
Figure 18:
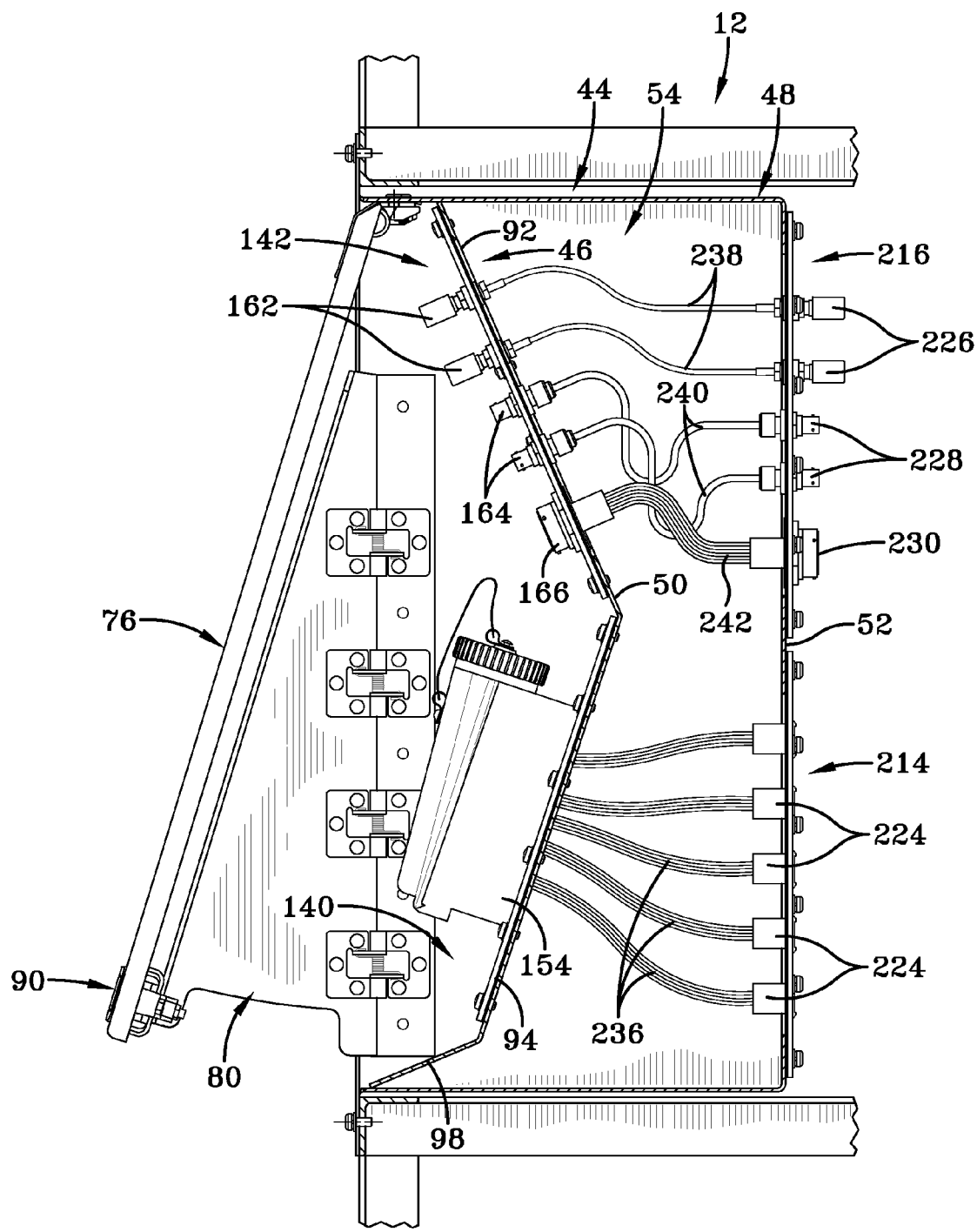
FIG. 18 is a cross-sectional view similar to FIG. 15, showing the interconnections between external electrical interface panels and internal electrical interface panels.

The signal interface assembly 12 illustratively includes a support 44 having a frame 46 coupled to a housing 48. The frame 46 is illustratively formed of a durable material, such as aluminum, and includes an outer support, such as outer frame or mounting bracket 50, spaced apart from an inner support, such as inner frame or mounting bracket 52. A chamber 54 is defined between the outer frame 50 and the inner frame 52 (FIGS. 4, 5, and 18). The housing 48 is illustratively coupled to the frame 46, for example, by welding, and includes a top wall 56, side walls 58 and 60, and a bottom wall 62. As with the frame 46, the housing 48 is illustratively formed of a durable material, such as aluminum. In certain illustrative embodiments, one or both of outer frame 50 and the inner frame 52 may be formed integral with the housing 48.

The housing 48 illustratively includes an outer end 64 and an inner end 66, wherein the chamber 54 is positioned intermediate the ends 64 and 66 (FIGS. 3 and 4). A mounting flange 68 is coupled to the outer end 64 of the housing 48 and includes a plurality of mounting apertures 70. Fasteners, such as rivets 72 (FIG. 1) may extend through the apertures 70 for securing the signal interface assembly 12 to the enclosure 22.

A first movable member, illustratively a cover 76, is pivotably coupled to the support 44 through a first hinge 78. A pair of second movable members, illustratively side wings 80, are pivotably coupled to the support 44 through a plurality of second hinges 82. The first hinge 78 permits pivoting movement of the cover 76 about a horizontal axis 84 (FIG. 3), while the second hinges 82 permit pivoting movement of the side wings 80 about respective vertical axes 86 (FIG. 4). As further detailed herein, the cover 76 pivots upwardly from a stowed position to a raised position (including a deployed position), and the side wings 80 pivot outwardly from stowed positions to deployed positions. A pair of latching mechanisms 90 are illustratively coupled to the cover 76 and are configured to secure together the cover 76 and respective side wings 80 when positioned in the stowed and deployed configurations.

Figure 6:
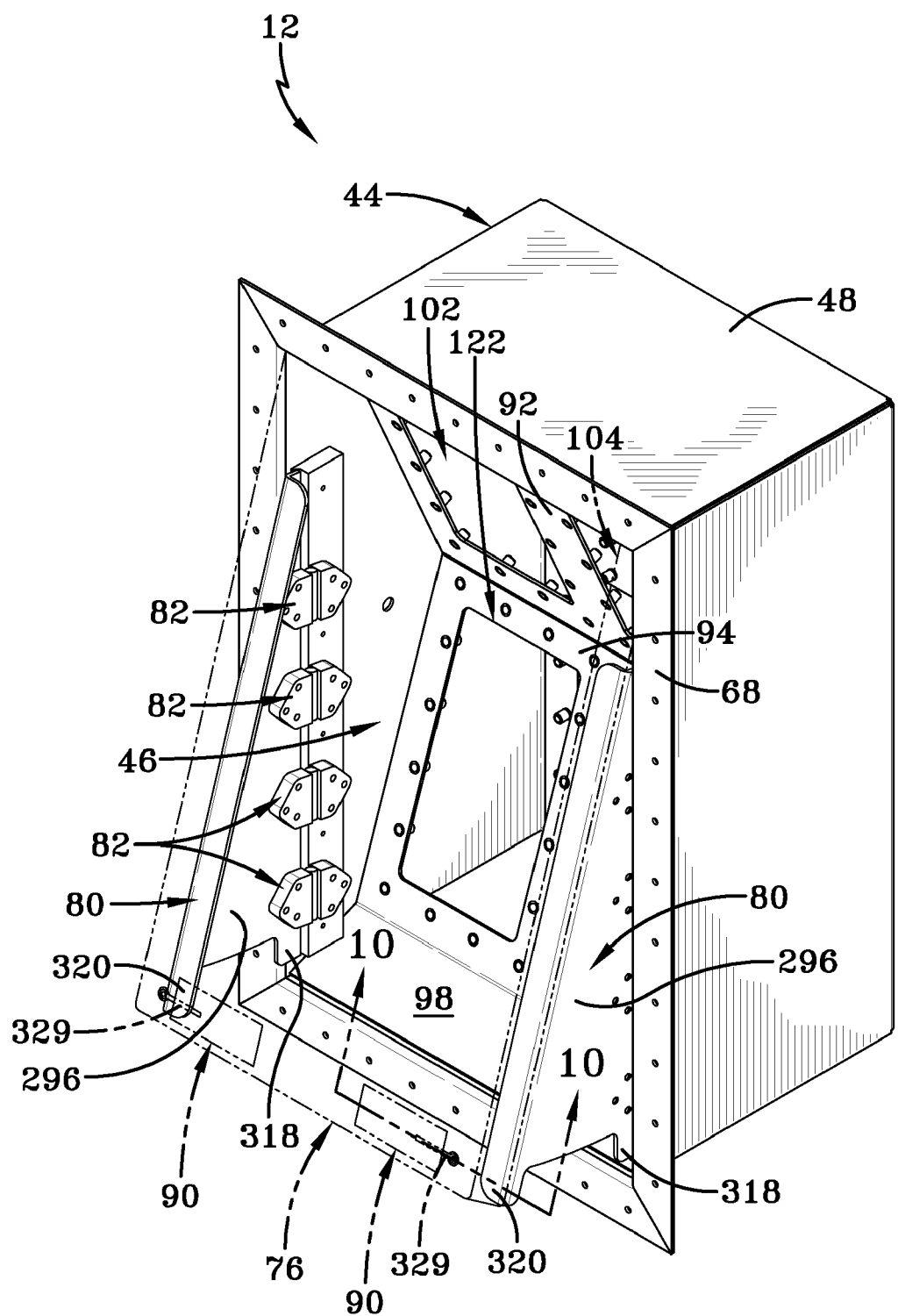
FIG. 6 is a view similar to FIG. 5, with the cover shown in phantom in a deployed position.
Figure 7:
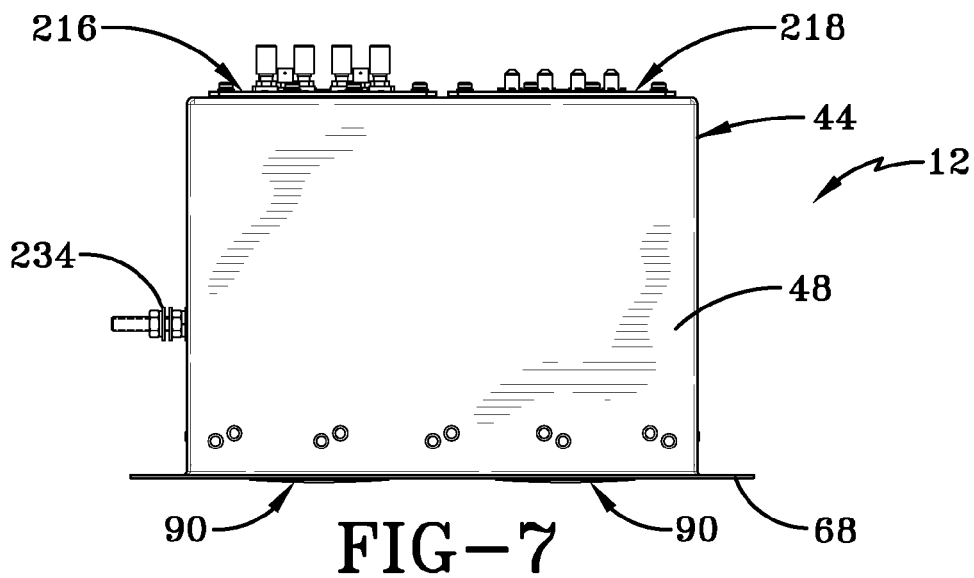
FIG. 7 is a top plan view of the electrical interface assembly of FIG. 3.
Figure 14:
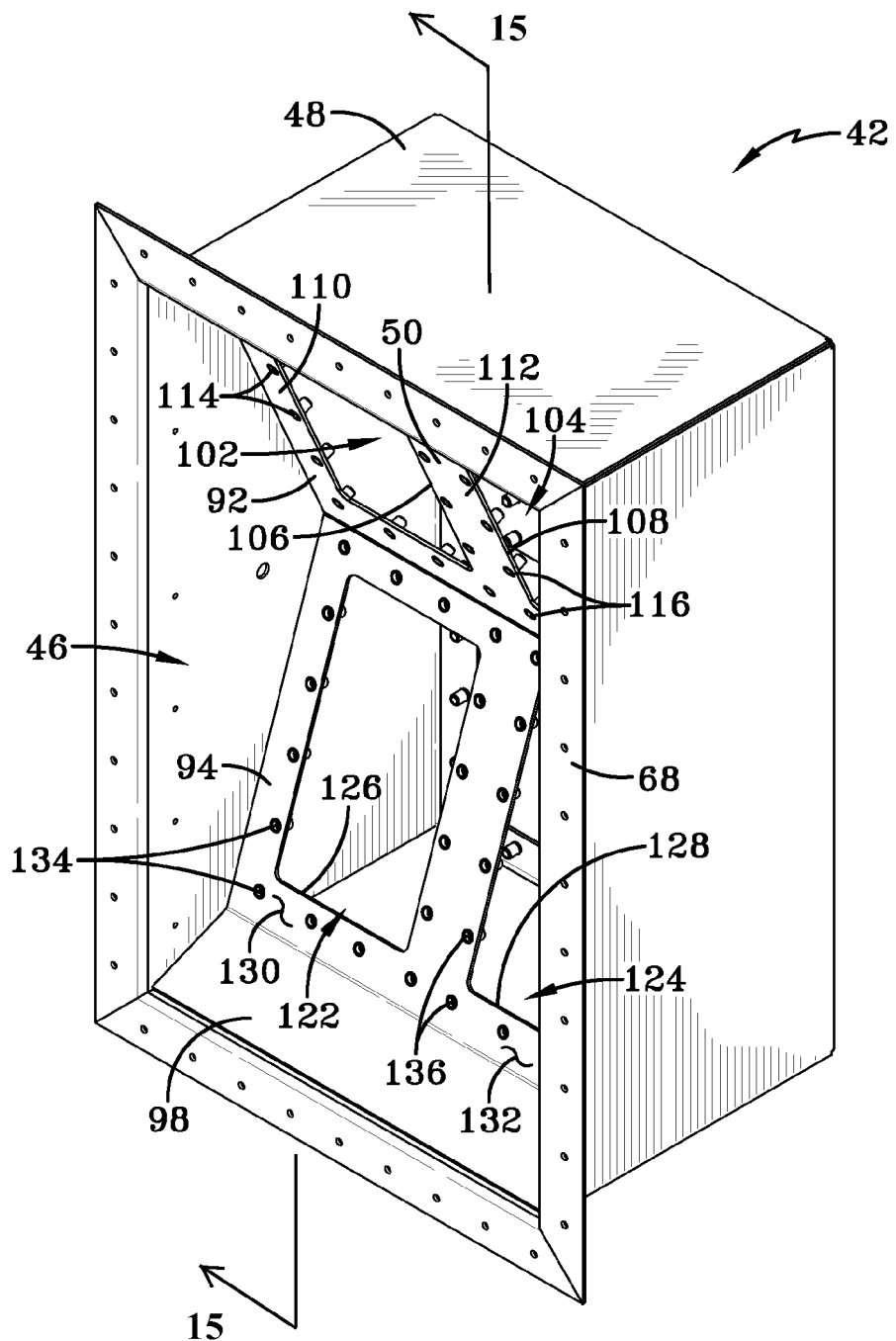
FIG. 14 is a perspective view similar to FIG. 4, with the cover and side wings removed for clarity.
Figure 15:
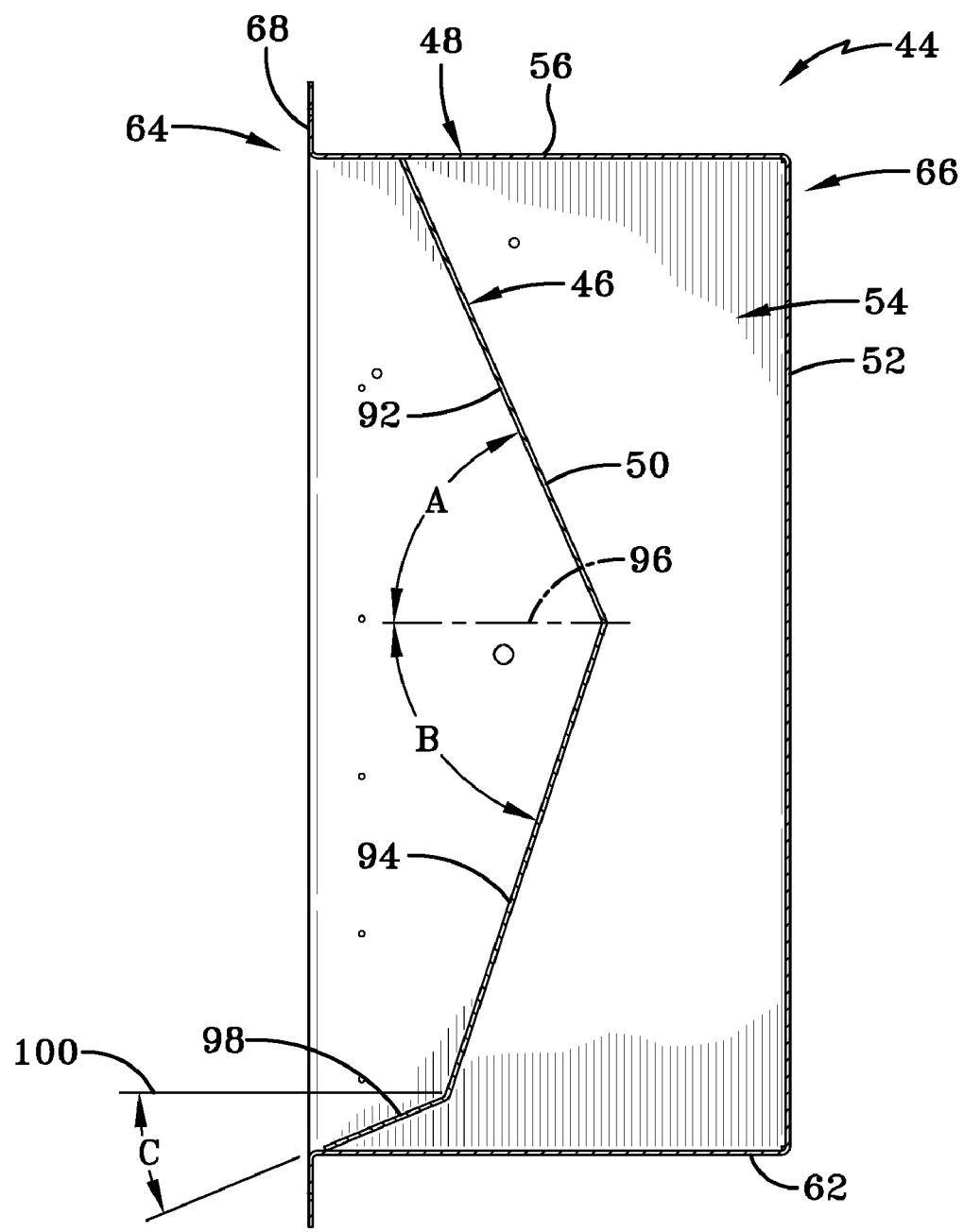
FIG. 15 is a cross-sectional view taken along line 15-15 of FIG. 14.

With reference to FIGS. 6, 14, and 15, the outer frame 50 includes an upper frame member 92 coupled to a lower frame member 94. Both the upper frame member 92 and the lower frame member 94 are angled relative to each other and to a horizontal axis 96. As shown in the illustrative embodiment of FIG. 15, the upper frame member 92 is angled upwardly from the horizontal axis 96 by angle A (illustratively 66 degrees), while the lower frame member 94 is angled downwardly from the horizontal axis 96 by angle B (illustratively 72 degrees). A deflector 98 is coupled to the lower frame member 94 and is configured to prevent water from collecting at the bottom of the signal interface assembly 12. As shown in the illustrative embodiment of FIG. 15, the deflector 98 is angled downwardly from a horizontal axis 100 by an angle C (illustratively 23 degrees) for directing water downwardly and outwardly from the signal interface assembly 12.

With reference to FIG. 14, the upper frame member 92 includes first and second openings 102 and 104 defined by rectangular mounting flanges 106 and 108, respectively. Outer surfaces of the mounting flanges 106 and 108 define respective gasket seats 110 and 112. A plurality of mounting apertures 114 and 116 extend through each mounting flange 106 and 108, respectively.

The lower frame member 94 includes first and second openings 122 and 124 defined by rectangular mounting flanges 126 and 128, respectively. Outer surfaces of mounting flanges 126 and 128 define respective gasket seats 130 and 132. A plurality of mounting apertures 134 and 136 extend through each mounting flange 126 and 128, respectively.

Figure 11:
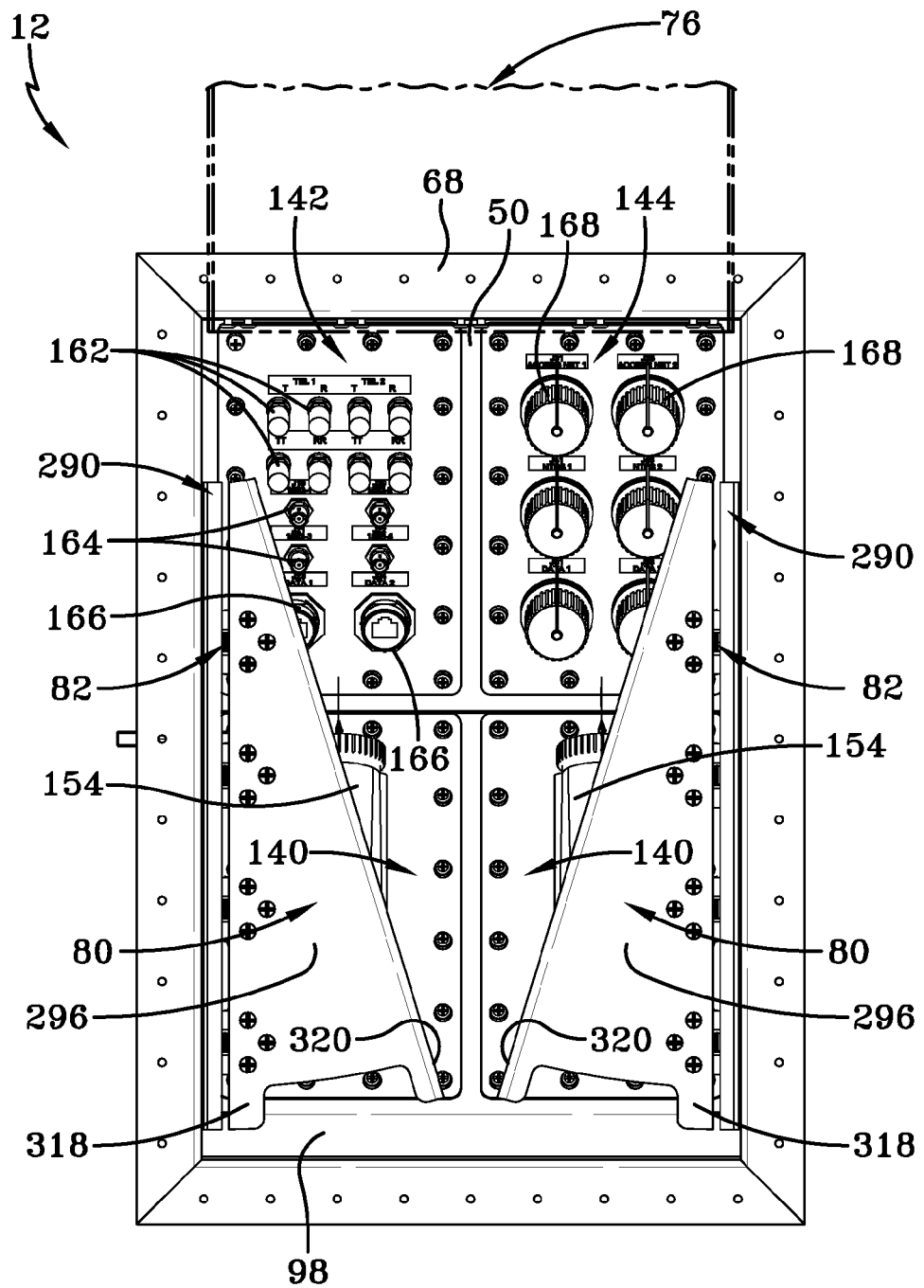
FIG. 11 is a front plan view similar to FIG. 8, showing the side wings in a stowed position and the cover in phantom in a fully raised position.
Figure 12:
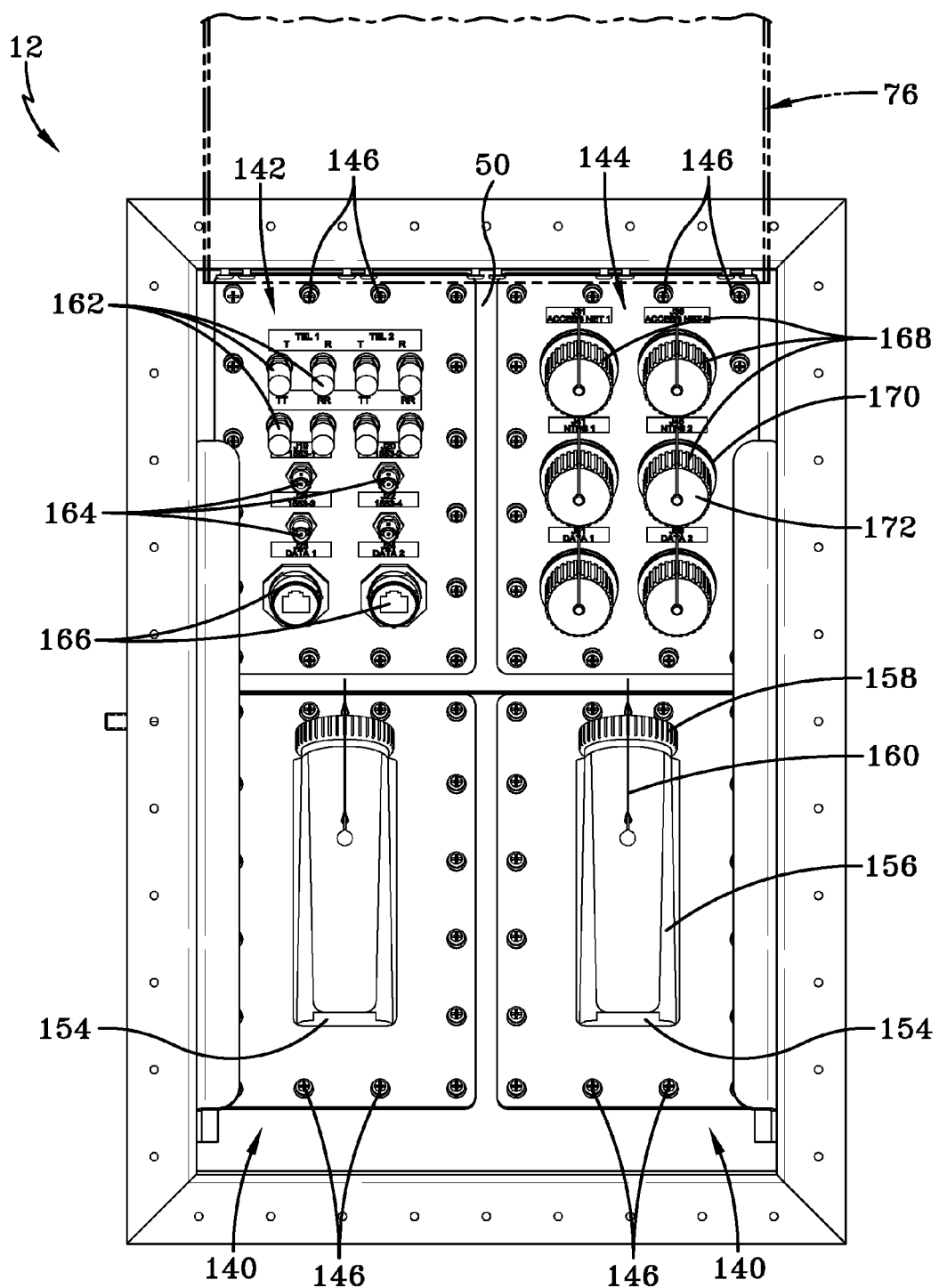
FIG. 12 is a front plan view similar to FIG. 11, showing the side wings in a deployed position.

With reference to FIGS. 11 and 12, a plurality of outer or external electrical interface panels, illustratively signal entry panels 140, 142, and 144, are removably coupled to the outer frame 50 by a plurality of releasable couplers or fasteners, illustratively bolts 146 received within the mounting apertures 114, 116, 134, 136 of the respective frame members 92 and 94 (FIG. 14). An electromagnetic interference (EMI) gasket 148 is received intermediate each signal entry panel 140, 142, 144 and its respective gasket seat 110, 112, 130, 132. The EMI gasket 148 is illustratively formed of an electrically conductive material, such as wire mesh material. In one illustrative embodiment, the EMI gasket 148 comprises a carbon-filled cellular PTFE matrix 150. A pressure sensitive adhesive (PSA) 152 may be supported by a rear surface of the matrix 150.

Each outer signal entry panel 140, 142 and 144 may be customized with a variety of different electrical connectors or ports as desired by the user for providing electrical communication with components external to the shelter assembly 18. As further detailed herein, the outer signal entry panels 140, 142, 144 are modular and may be easily removed and replaced with other electrical interface panels. While illustrative outer signal entry panels 140, 142, and 144 are shown to include certain types, arrangements, and numbers of electrical connectors, it should be appreciated that a wide variety of substitutions may be made therefor.

In the illustrative embodiment, outer signal entry panel 140 each include a telephone HAUC connector 154. HAUC connectors 154 are known and include a housing 156 supporting a receptacle for mating with a telephone, illustratively a handset including a microphone and a speaker (not shown). A cap 158 is removably coupled to the housing 156, while a cable 160 retains the cap 158 to the housing 156 (FIG. 12). The signal entry panel 142 illustratively includes a plurality of telephone push pins 162, and data ports 164 and 166. Data ports 164 illustratively comprise Tactical Digital Information Link (TADIL) connectors, such as TADIL-J 1553 bayonet couplings. Data ports 166 illustratively comprise female cable connectors, such as category 5 (CAT-5e) cable connectors. The outer signal entry panel 144 illustratively includes a plurality of data ports 168 for coupling to fiber optic cables. Illustratively, the data ports 168 comprise Tactical Fiber Optic Cable Assembly (TFOCA-11) connectors including a housing 170 and threadably coupled protective caps 172.

Figure 13:
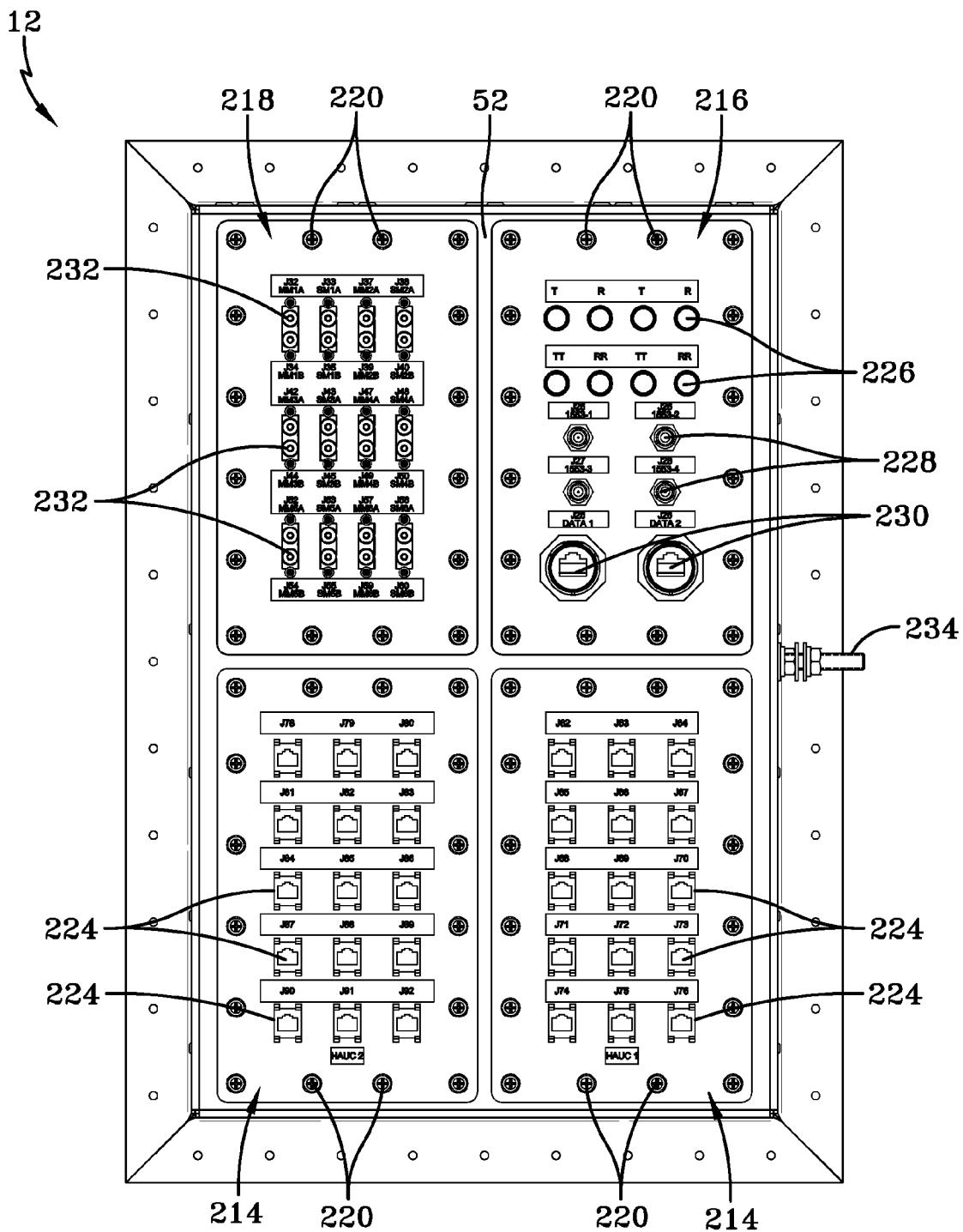
FIG. 13 is a rear view of the electrical interface assembly of FIG. 7.
Figure 16:
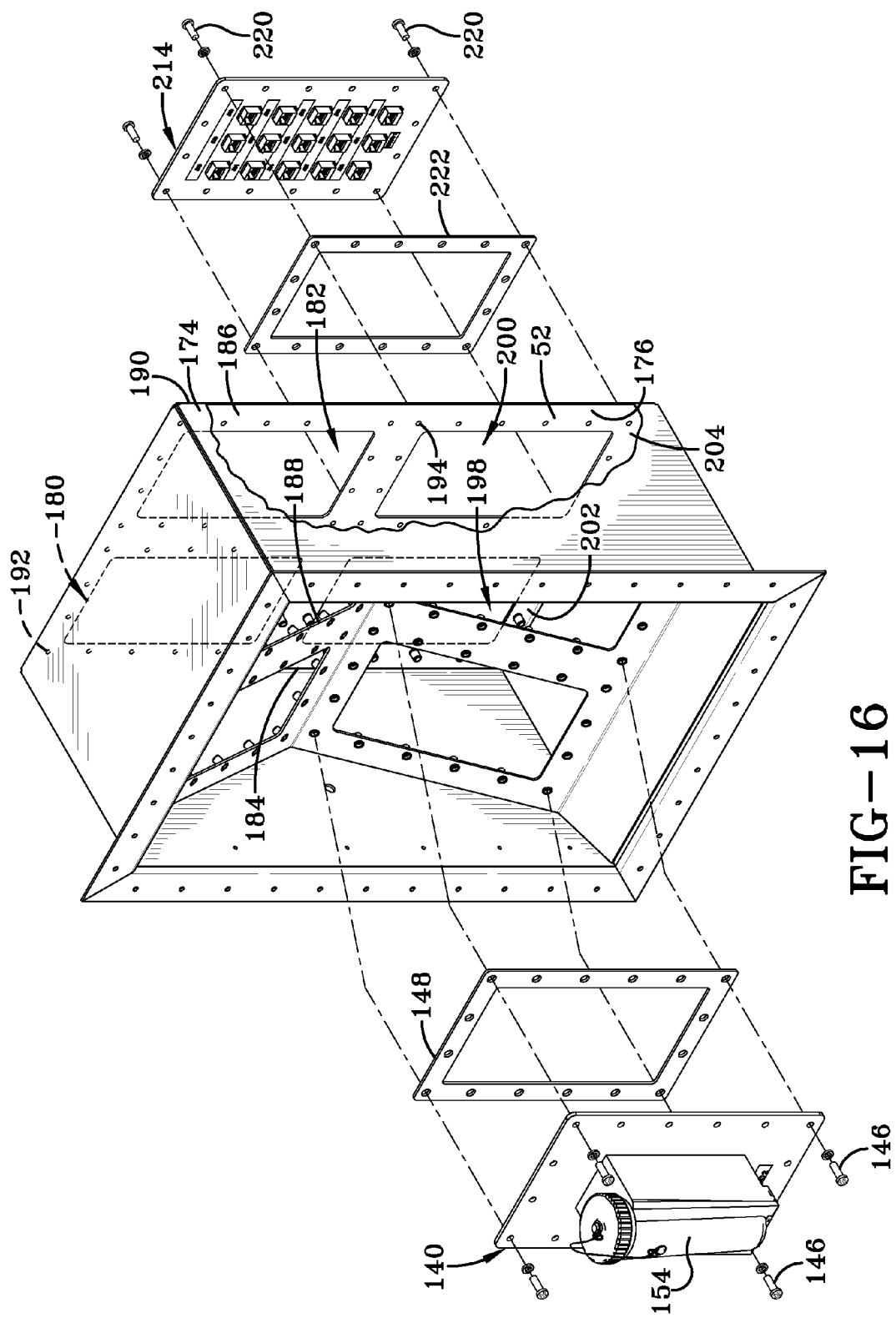
FIG. 16 is a front exploded perspective view, with a partial cut-away, showing illustrative mounting arrangements for an external electrical interface panel and an internal electrical interface panel.
Figure 17:
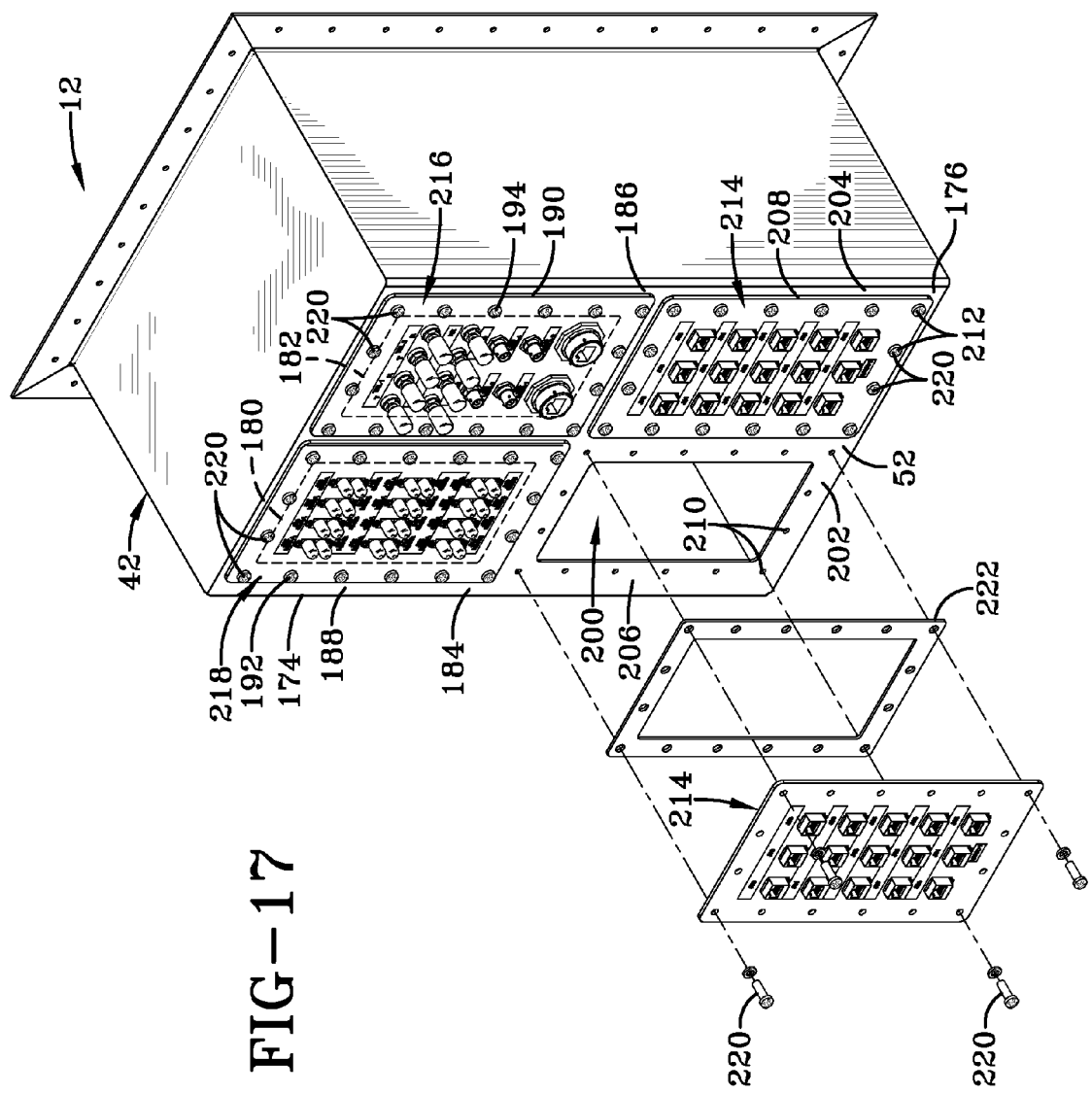
FIG. 17 is a rear exploded perspective view showing an illustrative mounting arrangement for internal electrical interface panels.

With reference to FIGS. 13, 16, and 17, the inner frame 52 illustratively includes an upper frame member 174 and a lower frame member 176 disposed within a common substantially vertical plane. The upper frame member 174 includes first and second openings 180 and 182 defined by rectangular mounting flanges 184 and 186, respectively. Outer surfaces of the mounting flanges 184 and 186 define respective gasket seats 188 and 190. A plurality of mounting apertures 192 and 194 extend through each mounting flange 184 and 186, respectively. The lower frame member 176 includes first and second openings 198 and 200 defined by rectangular mounting flanges 202 and 204, respectively. Outer surfaces of the mounting flanges 202 and 204 define respective gasket seats 206 and 208. A plurality of mounting apertures 210 and 212 extend through each mounting flange 202 and 204, respectively.

A plurality of inner or internal electrical interface panels, illustratively signal entry panels 214, 216, and 218, are removably coupled to the inner frame 52 by a plurality of releasable couplers or fasteners, illustratively bolts 220 received within the mounting apertures 192, 194, 210, 212 of respective frame members 174 and 176. An EMI gasket 222 is received intermediate each signal entry panel 214, 216, 218 and its respective gasket seat 188, 190, 206, 208. The EMI gaskets 222 are illustratively of a similar construction as EMI gaskets 148 detailed above.

Each inner signal entry panel 214, 216, 218 may be customized with a variety of different electrical connectors or ports as desired by the user for providing electrical communication with components internal to the shelter assembly 18. As further detailed herein, the panels 214, 216, 218 are modular and may be easily removed and replaced with other electrical interface panels as desired. While illustrative inner signal entry panels 214, 216, and 218 are shown to include certain types, arrangements, and numbers of electrical connectors, it should be appreciated that a wide variety of substitutions may be made therefor.

In the illustrative embodiment, inner signal entry panels 214 each include a plurality of telephone connectors, illustratively RJ-45 modular connectors 224. The signal entry panel 216 illustratively includes a plurality of telephone push pins 226 and data ports 228 and 230. Data ports 228 illustratively comprise TADIL connectors, such as TADIL-J 1553 bayonet couplings. Data ports 230 illustratively comprise female cable connectors, such as category 5 (CAT-5e) cable connectors. The signal entry panel 218 illustratively includes fiber optic couplings 232, such as SC MMSM connectors. A ground stud 234 may also be supported by the inner frame 52.

Electrical wires or cables 236, 238, 240, 242 illustratively connect the outer signal entry panels 140, 142, 144 with the inner signal entry panels 214, 216, 218, respectively. More particularly, the cables 236, 238, 240, 242 extend between the outer frame 50 and the inner frame 52 through the chamber 54 of the support 44 (FIG. 18). The HAUC connectors 154 of outer signal entry panel 140 are illustratively coupled to the modular connectors 224 of panel 214 by cables 236. The push pins 162 of the outer signal entry panel 142 are illustratively coupled to the push pins 226 of the inner signal entry panel 216 by cables 238. The data ports 164 and 166 of the outer signal entry panel 142 are coupled to the data ports 228 and 230 of panel 216 by cables 240 and 242, respectively. Similarly, the ports 168 of the outer signal entry panel 144 are illustratively coupled to the couplings 232 of the internal signal entry panel 218 through cables (not shown). As desired, lighting arrestors and filters (not shown) may be electrically coupled to the cables 236, 238, 240, 242 and received within the chamber 54.

Figure 19:
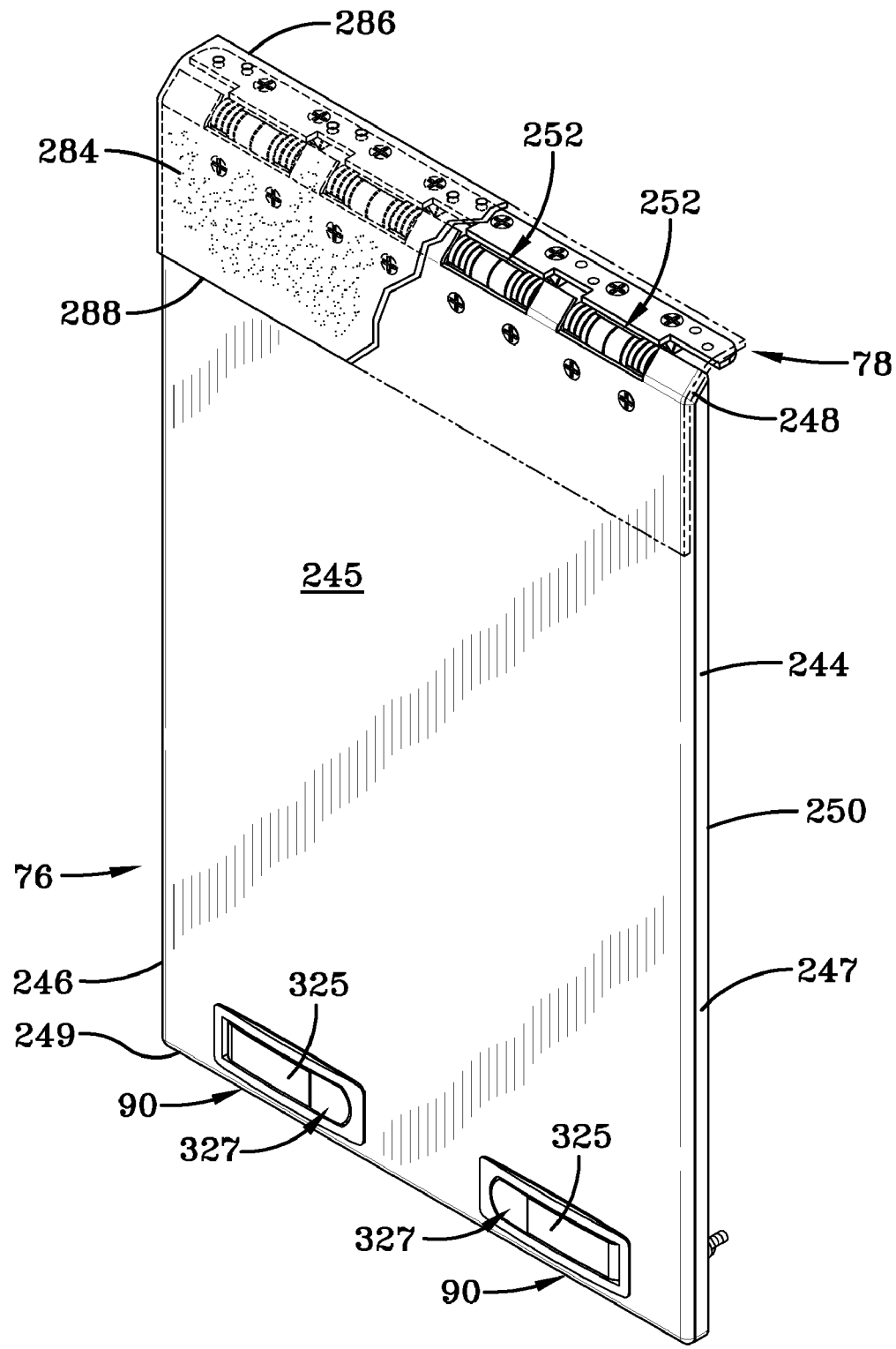
FIG. 19 is a perspective view of the cover of the electrical interface assembly of FIG. 3.
Figure 20:
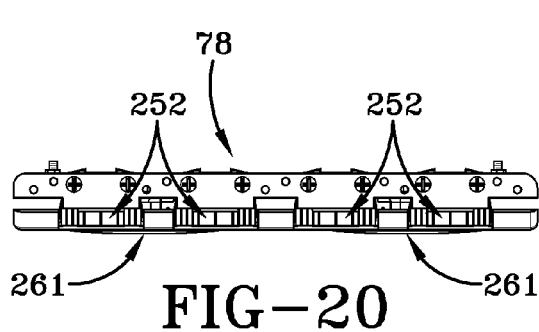
FIG. 20 is a top plan view of the cover of FIG. 19.
Figure 21:
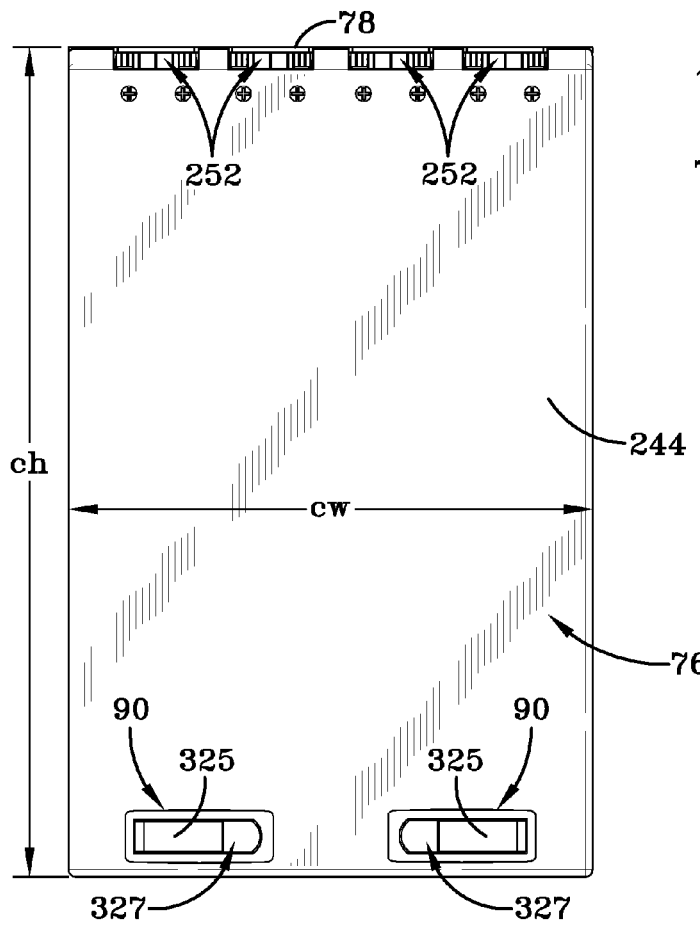
FIG. 21 is a front view of the cover of FIG. 19.
Figure 22:
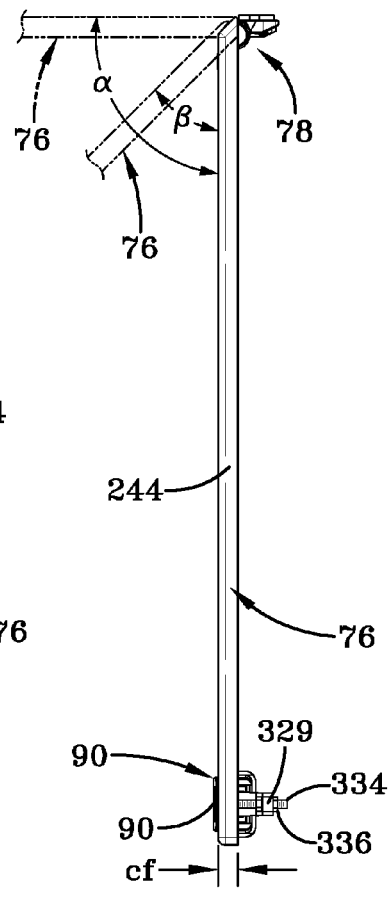
FIG. 22 is a side elevational view of the cover of FIG. 19, showing fully raised and deployed positions in phantom.
Figure 33:
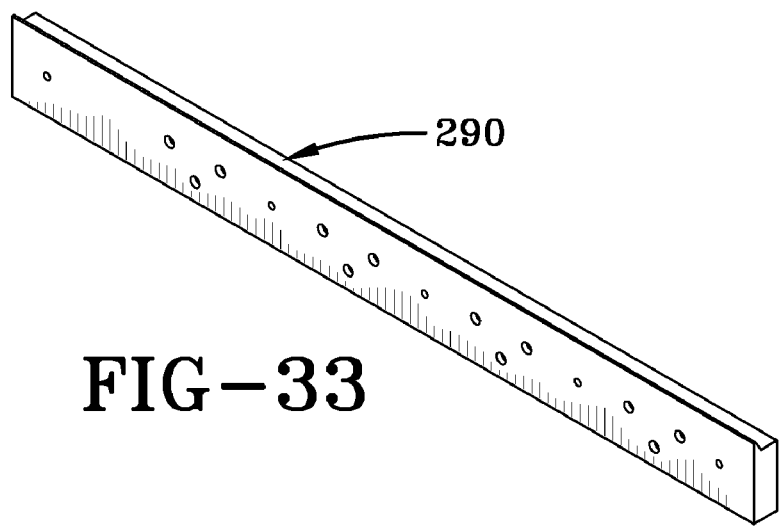
FIG. 33 is a perspective view of a side wing stand-off of FIG. 24.
Figure 34:
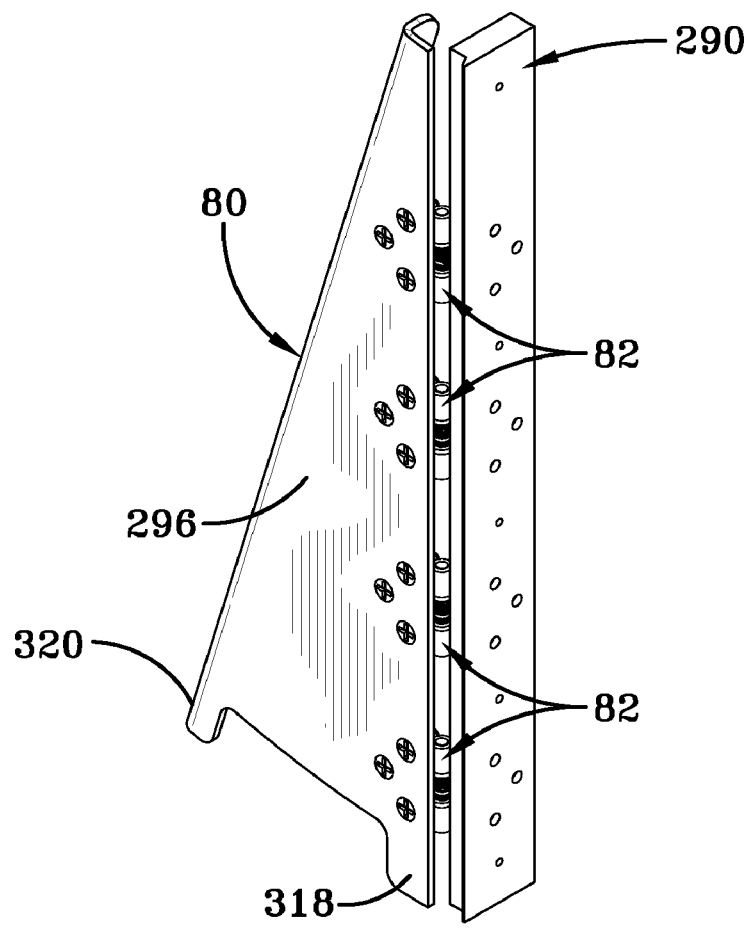
FIG. 34 is a perspective view of a further side wing of the electrical interface assembly of FIG. 3.

With reference to FIGS. 19-22, the cover 76 is pivotably coupled to the top wall 56 of the housing 48 by a first hinge 78. The cover 76 illustratively includes a substantially planar body 244 having an outer surface 245 extending between first and second sides 246 and 247 and between opposing upper and lower ends 248 and 249. While the body 244 of the cover 76 may be formed in a wide variety of sizes, the illustrative embodiment has a width cw of approximately 13 inches, and a height ch of approximately 20 inches (FIG. 21). In one illustrative embodiment, the cover 76 is formed of 0.090 inch thick aluminum sheet. The first hinge 78 is coupled to the body 244 proximate the upper end 248, while the latching mechanisms 90 are secured to the body 244 proximate the lower end 249 near opposing sides 246 and 247. In the illustrative embodiment as shown in FIG. 22, a peripheral lip or flange 250 extends inwardly from the body 244 by a distance cf (illustratively about 0.50 inches).

Figure 23:
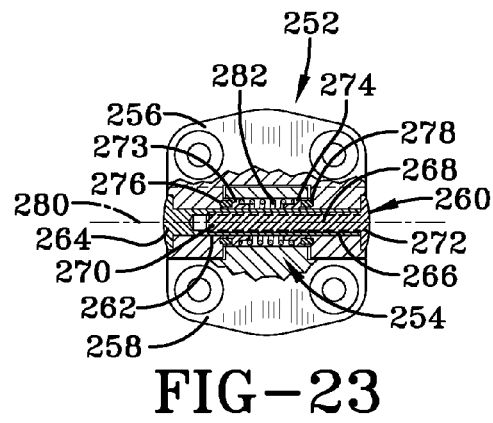
FIG. 23 is a detail view, with a partial cut-away, of a side wing hinge.

With reference to FIGS. 20 and 23, the first hinge 78 illustratively includes a plurality of spaced apart connecting members 252. Each connecting member 252 illustratively includes a detent assembly 254 to releasably secure the cover 76 in one of a plurality of angular positions. More particularly, the cover 76 in FIG. 22 is shown in solid in a stowed position substantially vertical (i.e., parallel with the vertical wall 26). The cover 76 may be pivoted upwardly by angle α (illustratively about 90 degrees) to a fully raised position, and by angle β (illustratively about 45 degrees) to an intermediate deployed position.

As shown in FIG. 23, each connecting member 252 illustratively includes a first pivot body 256 and a second pivot body 258 operably coupled together for pivoting movement by a pivot pin 260. Torsion springs 261 may be provided to angularly bias the second pivot body 258 away from the first pivot body 256. As such, the springs 261 assist the user in raising the cover 76.

The pivot pin 260 of each connecting member 252 illustratively includes a first member 262 having a head 264 at a first end, and a cavity 266 at an opposing second end. A second member 268 is concentrically received within the cavity 266 of the first member 262. More particularly, a portion 270 adjacent the first end of the second member 268 is fixed within the cavity 266, and a head 272 is positioned adjacent the second end. The first and second members 262 and 268 are secured together such that the first and second pivot bodies 256 and 258 are captured between the heads 264 and 272.

The detent assembly 254 illustratively includes spaced apart first and second sliders 273 and 274 configured to cooperate with recesses or detents 276 and 278, respectively, formed within the pivot body 256. More particularly, each slider 273, 274 is configured to be releasably received within a cooperating detent 276, 278 in each of the angular positions shown in FIG. 22. The sliders 273 and 274 illustratively comprise sleeves received over the pivot pin 260 and supported for sliding movement along the longitudinal axis 280 of the pin 260. More particularly, a spring 282 is configured to bias the sliders 273 and 274 in opposite directions along the longitudinal axis 280 and into selected ones of the detents 276 and 278. When the sliders 273 and 274 are biased within the detents 276 and 278, the cover 76 is releasably secured within one of the angular positions shown in FIG. 22.

As shown in FIG. 19, a protective flap or shield 284 may extend over the first hinge 78 to prevent environmental elements (e.g., rain, sand and dirt) from passing through gaps in the hinge 78 and to the outer signal entry panel 140, 142 and 144. More particularly, the protective shield 284 illustratively comprises a flexible sheet having a first or upper end 286 secured to the first hinge 78 by fasteners, such as screws, and a second or lower end 288 free to move relative to the cover 76. Illustratively, the protective shield 284 is formed of a durable and flexible material, such as an elastomeric sheet.

With reference to FIGS. 24-34, each side wing 80 is pivotably coupled by a plurality of second hinges 82 to a spacer or standoff 290. In turn, each standoff 290 is secured to a side wall 58, 60 of the housing 48 (FIG. 5). Each standoff 290 may be formed of an elastomeric body 292 secured to the side wall 58, 60 by a plurality of fasteners, such as screws 294. The standoffs 290 provide clearance from the sidewalls 58 and 60 to accommodate pivoting movement of the side wings 80.

Each side wing 80 illustratively includes a substantially planar body 296 extending between a first side 298 and a second side 300. While the body 296 of each side wing 80 may be formed from a wide variety of rigid, durable materials, in the illustrative embodiment the body 296 is formed of 0.125 inch thick aluminum sheet. The first side 298 includes a substantially vertical edge 302, while the second side 300 illustratively includes an angled edge 304. The second side 300 illustratively includes an inwardly extending lip or flange 306. As shown in the illustrative embodiment of FIG. 31, the flange 306 extends inwardly from the body 296 by a distance sf (illustratively about 0.88 inches).

With reference to FIGS. 28 and 30, the body 296 of each side wing 80 has a substantially triangular shape with an apex 308 at an upper end 310 and a base 312 at a lower end 314 (FIG. 24). As shown in FIG. 30, the vertical edge 302 is illustratively angled relative to the angled edge 304 by approximately 17 degrees. The second hinges 82 are coupled to the body 296 proximate the first side 298 and provide for pivoting movement of the wings 80 from the stowed position of FIGS. 8 and 9 to the deployed position of FIGS. 6 and 10. The base 312 includes a cut-out or notch 316 defining opposing first and second sections of the body 296, illustratively first and second tabs 318 and 320. The notch 316 is configured to provide clearance for a portion of the latching mechanism 90 when the cover 76 and the side wings 80 are in their stowed positions. The base 312 of the body 296 illustratively has a width sw of approximately 5.4 inches (FIG. 28), while the vertical edge 302 illustratively has a height sh of approximately 16 inches (FIG. 30). The angled edge 304 illustratively has a length sl of approximately 16.02 inches (FIG. 31). Additional illustrative dimensions of the tabs 318 and 320 defining the notch 316 are shown in FIG. 30.

With reference to FIG. 27, each of the plurality of second hinges 82 illustratively includes a first pivot body 322 operably coupled to a second pivot body 324 by a pivot pin 326 to provide pivoting movement therebetween. The first pivot body 322 is secured to the standoff 290 while the second pivot body 324 is secured to the respective side wing 80. A torsion spring 328 is configured to angularly bias about the pivot pin 326 the second pivot body 324 away from the first pivot body 322. As such, the torsion spring 328 biases the respective side wings 80 outwardly about vertical axis 86 (FIG. 26) from the stowed position (FIG. 4) to the deployed position (FIG. 6).

As explained above, the latching mechanisms 90 are configured to secure together the cover 76 and the side wings 80 in a plurality of configurations. More particularly, in the illustrative embodiment, the latching mechanisms 90 are configured to secure together the cover 76 and the side wings 80 in relative positions in either of their respective stowed or deployed configurations.

Figure 8:
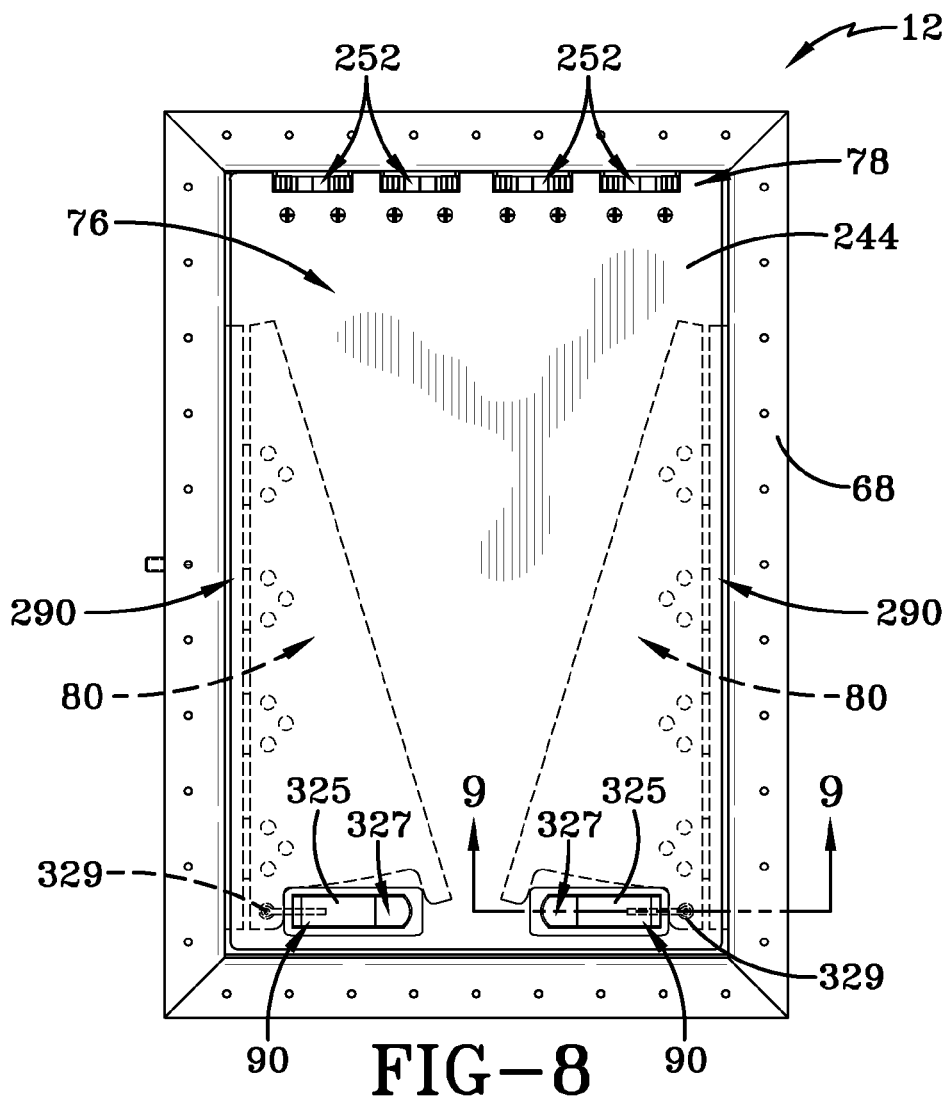
FIG. 8 is a front view of the electrical interface assembly of FIG. 7.
Figure 9:
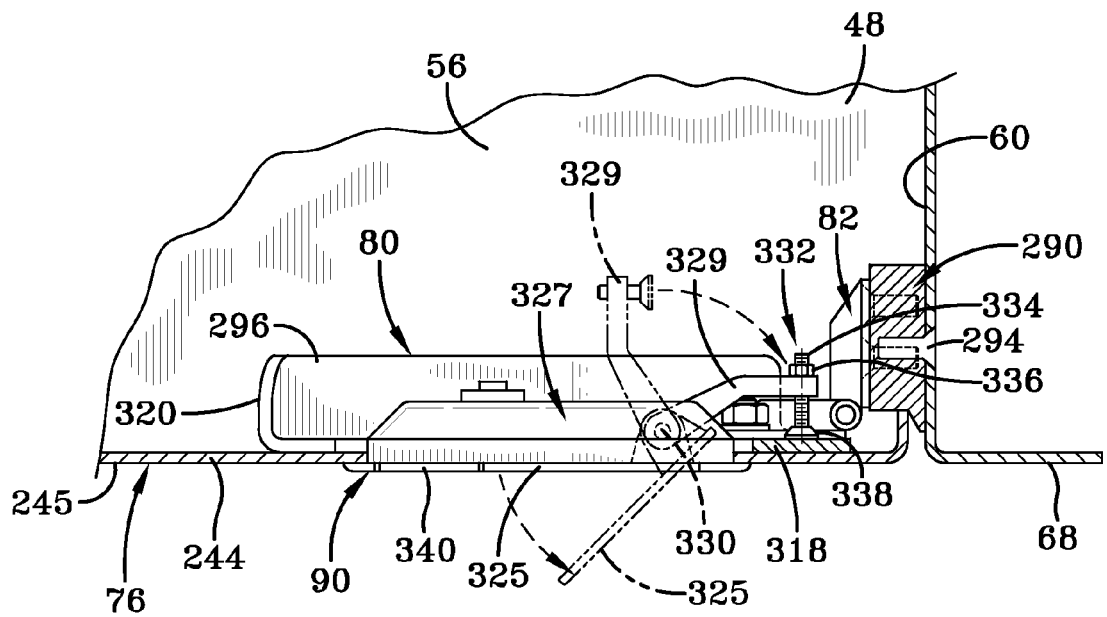
FIG. 9 is a cross-sectional view taken along line 9-9 of FIG. 8.

FIGS. 8 and 9 show locked and unlocked positions (in solid and hidden lines, respectively) of latching mechanism 90 when the cover 76 and side wings 80 are in their stowed configurations. In the stowed configurations, the cover 76 and the side wings 80 extend substantially parallel to each other and to the vertical wall 26 to define a substantially flush outer surface 323 (FIG. 1). As further shown in the stowed configurations of FIGS. 8 and 9, the first side 298 of each side wing 80 is positioned adjacent the flange 250 at respective sides 246 and 247 of the cover 76. As detailed in FIG. 9, the latching mechanisms 90 secure the first tabs 318 of each side wing 80 to the cover 76. The standoff 290 may serve as a buffer or stop to contact the flange 250 at respective sides 246 and 247 of the cover 76.

Figure 10:
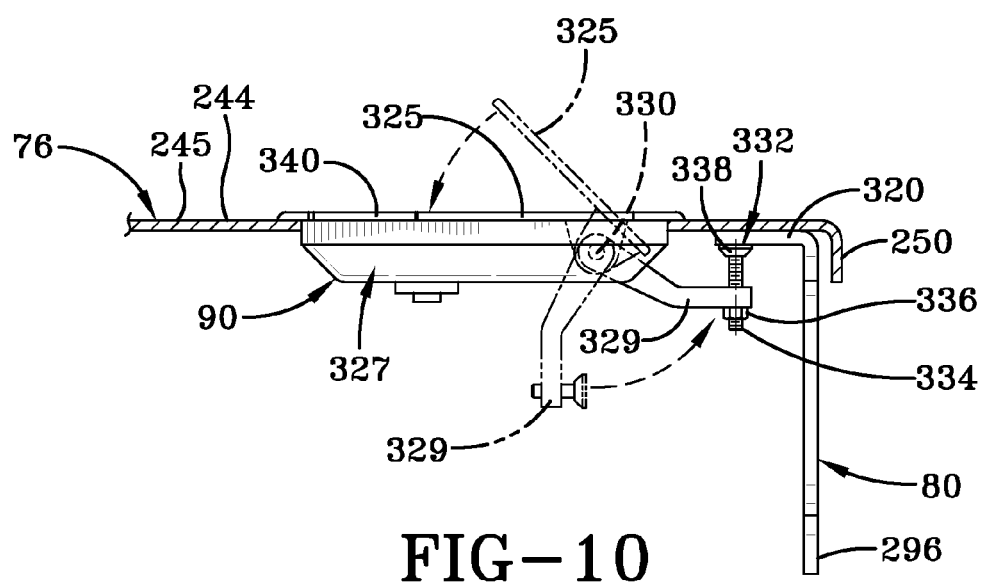
FIG. 10 is a cross-sectional view taken along line 10-10 of FIG. 8.

FIGS. 6 and 10 show locked and unlocked positions (in solid and hidden lines, respectively) of the cover 76 and the side wings 80 are in their deployed configurations. In the deployed configurations, the cover 76 is angled upwardly from its vertical position by angle β of about 45 degrees from its position of FIG. 8. As shown in FIG. 6, the side wings 80 are angled outwardly from their folded positions of FIG. 8 by about 90 degrees. As shown in the deployed configurations of FIGS. 6 and 10, the second side 300 of each side wing 80 is positioned adjacent the flange 250 at the respective sides 246 and 247 of the cover 76. As detailed in FIG. 10, the latching mechanisms 90 secure the flange 250 at the second side tabs 320 of each side wing 80 to the cover 76.

With further reference to FIGS. 6-10, each latching mechanism 90 illustratively includes a handle 325 received within a recess 327 formed in the outer surface 245 of the cover 76. A lever arm 329 is coupled to the handle 325 and is configured to pivot about a pivot pin 330. An adjustable clamp 332 is supported at a first end of the lever arm 329, while the handle 325 is coupled to the second end of the lever arm 329. The clamp 332 includes a threaded stud 334 cooperating with a nut 336 for adjusting the position of a resilient bearing member 338. The latching mechanism 90 defines an over-center clamp by the handle 325 and the lever arm 329 being positioned on opposite sides of the pivot pin 330.

The latching mechanism 90 is in a locked or clamped position when the handle 325 is substantially parallel to the outer surface 245 of the cover 76 (shown in solid lines in FIGS. 9 and 10). FIG. 9 shows the stowed configuration where the clamp 332 in the lock position secures the first tab 318 of the side wing 80 to the body 244 of the cover 76. FIG. 10 shows the deployed configuration where the clamp 332 in the locked position secures the second tab 320 of the side wing 80 to the body 244 of the cover 76. By the user inserting a finger within an opening 340 adjacent to the handle 325, the handle 325 may be lifted or pulled outwardly away from the cover 76 such that the handle 325 and the lever arm 329 are pivoted about pivot pin 330 (to the position shown in hidden lines in FIGS. 9 and 10). Once the cover 76 and cooperating side wings 80 are positioned as desired (i.e., stowed or deployed), the handle 325 may be pushed back into the recess 327 and flush with the outer surface 245 of the cover 76. The lever arm 329 rotates such that the clamp 332 secures the cover 76 to the respective side wing 80.

An illustrative method of accessing an interface panel of signal interface assembly 12 comprises the steps of releasing the latching mechanisms 90 securing cover 76 to the side wings 80 (FIGS. 8 and 9) when in the stowed configuration. In the stowed configuration, the cover 76 extends substantially parallel to the side wings 80 to provide a flush outer surface to the support 44. To release the latching mechanisms 90, the handles 325 are pivoted outwardly from the recesses 327 of cover 76. In response, the lever arms 329 unclamp the cover 76 from the first tabs 318 of the side wings 80. Next, the cover 76 is pivoted upwardly about horizontal axis 100, illustratively by angle α to the fully raised position shown in FIG. 22. The detent assemblies 254 are configured to releasably hold the cover 76 in this position.

The side wings are 80 are then pivoted outwardly about vertical axis 86 into the deployed position shown in FIG. 6. The step of pivoting the side wings 80 outwardly includes biasing the side wings 80 through a spring 282. The cover 76 is then lowered (pulling down will release the detent assemblies 254) to the deployed position represented by angle β in FIG. 22. In the deployed configuration, the cover 76 extends substantially perpendicular to the side wings 80 and at an acute angle relative to vertical. In this position, the flange 250 of the cover 76 receives the second tab 320 of each side wing 80 in a nesting arrangement. Next, the latching mechanisms 90 are engaged to secure the cover 76 to the side wings 80. More particularly, the handles 325 are pivoted inwardly into the recesses 327 of the cover 76. In response, the lever arms 329 clamp the cover 76 to the second tab 320 of the side wings 80.

A method of installing a signal entry panel comprises the steps of providing support 44, and coupling signal entry panel 140, 142, 144, 214, 216, 218 to the support 44. The support 44 illustratively includes outer frame 50 and inner frame 52. EMI gasket 148 is positioned adjacent the outer frame 50, and the outer signal entry panel 140, 142, 144 is positioned adjacent the outer frame 50 with the EMI gasket 148 being intermediate the panel 140, 142, 144, and the outer frame 50. Bolts 146 are threadably secured within the outer frame 50 to retain the outer signal entry panel 140, 142, 144 in position.

Cables are illustratively used to electrically couple the outer signal entry panel 140, 142, 144, to the respective inner signal entry panel 214, 216, 218. EMI gasket 222 is positioned against inner frame 52 and the inner signal entry panel 214, 216, 218 is then retained in position through bolts 220 threadably secured within the inner frame 52.

As may be appreciated, the mounting arrangements of the outer and inner signal entry panels 140, 142, 144, 214, 216, 218 facilitate replacement by substitute panels. Moreover, bolts 146, 220 permit removal and replacement of signal entry panels 140, 142, 144, 214, 216, 218 on the outer frame 50 and the inner frame 52, respectively. Once installation is complete, the cover 76 and side wings 80 may be operated as detailed herein to protect the outer signal entry panels 140, 142, 144 from environmental elements.

Figure 35:
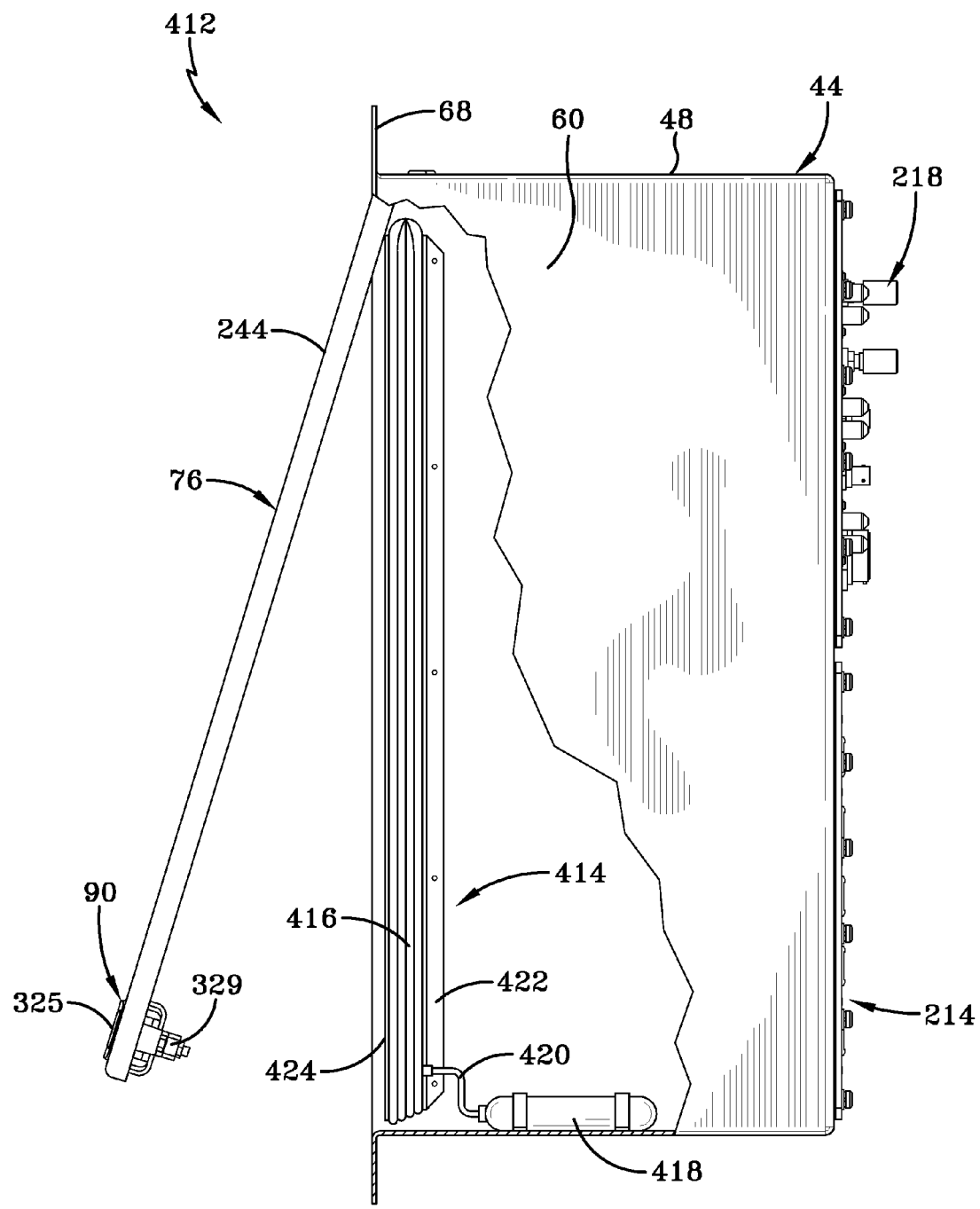
FIG. 35 is a side elevational view, with a partial cut-away, of a further illustrative embodiment electrical interface assembly of the present disclosure.
Figure 36:
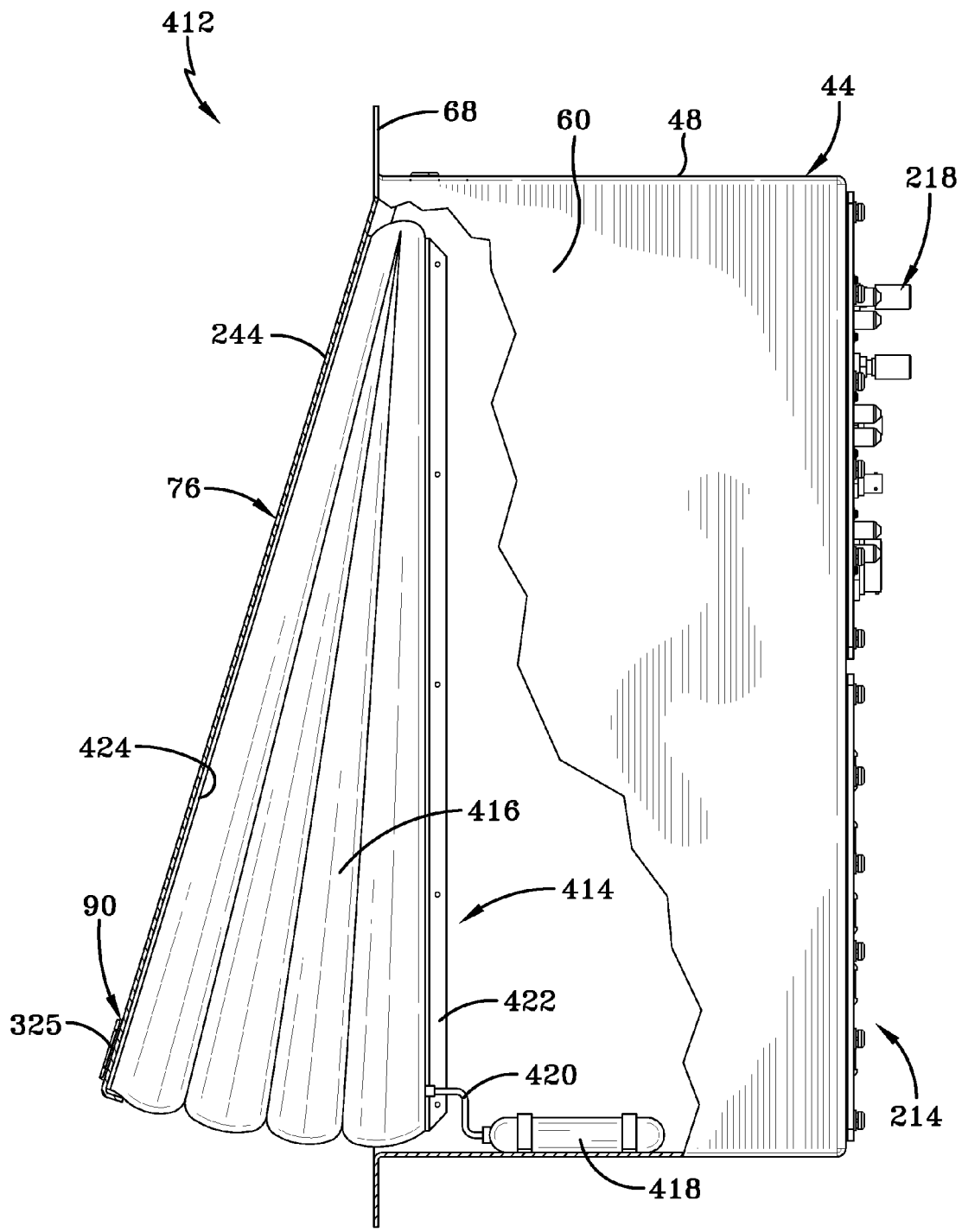
FIG. 36 is a view similar to FIG. 35, showing the cover in a deployed position.

As shown in FIGS. 35 and 36, a further illustrative signal interface assembly 412 includes many similar features to the embodiments detailed above. As such, similar elements will be identified with like reference numbers. The signal interface assembly 412 illustratively includes flexible side shields 414 configured to extend adjacent, and in laterally spaced relation to, the side wings 80. In certain embodiments, the flexible side shields 414 may replace the side wings 80. The side shields 414 further assist in preventing environmental elements, such as water, sand, and debris, from contacting the signal entry panels 214. The side shields 414 may each comprise an inflatable bladder 416 fluidly coupled to a fluid supply 418, such as a pneumatic pump or storage canister, through a fluid supply line 420. A first end of the bladder 416 illustratively includes a mounting strip 422 secured to the housing, while a second end of the bladder 416 illustratively includes a magnetic coupler 424 for releasable coupling to an inner surface of the cover 76.

FIG. 35 shows the bladder 416 in a deflated state and disconnected from the cover 76, while FIG. 36 shows the bladder 416 inflated and coupled to the cover 76. The fluid supply 418 may be activated for inflating the bladder 416 through a user interface, such as a user controlled switch, or through a sensor, such as a limit switch 426 configured to detect when the cover 76 is raised.

Figure 37:
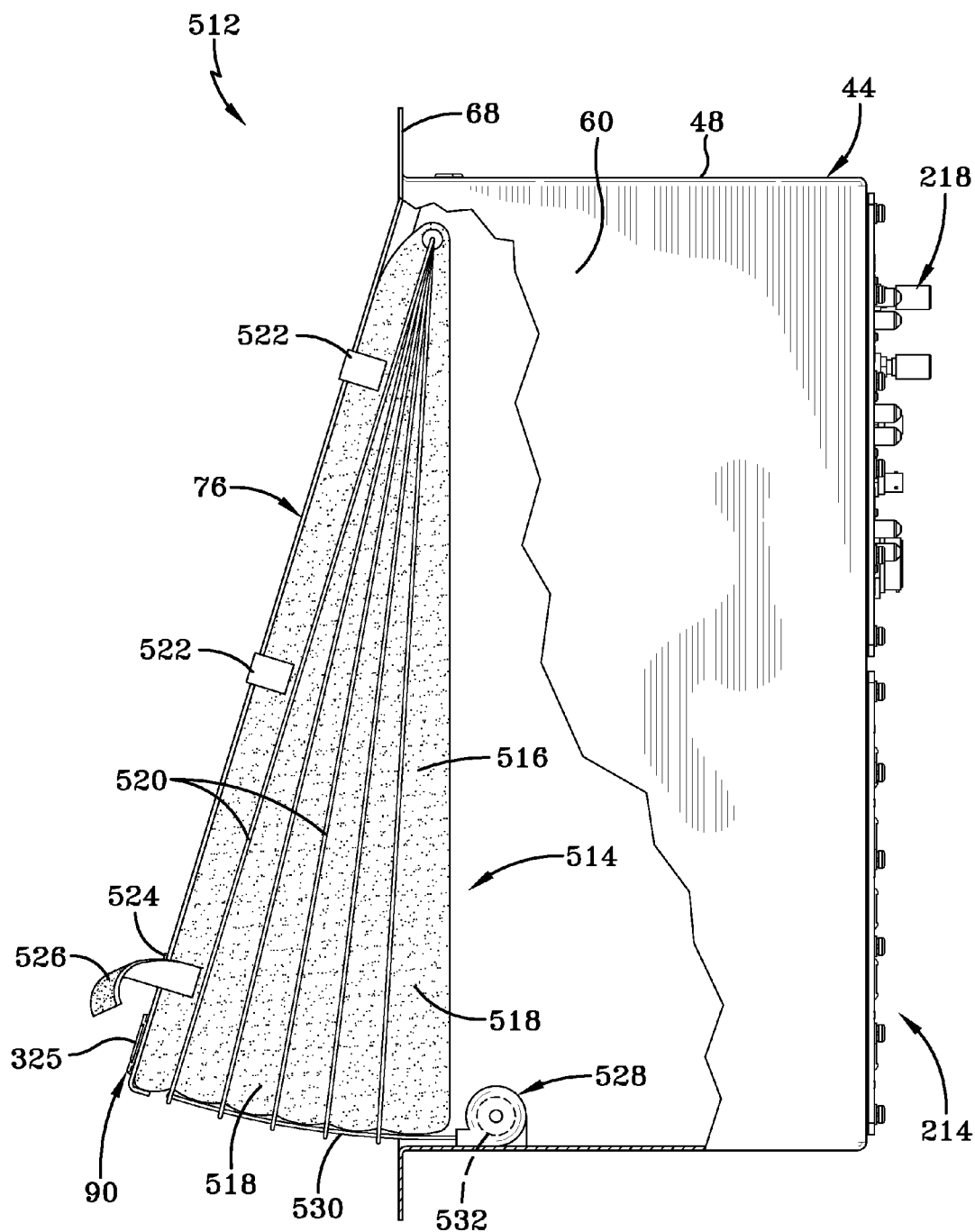
FIG. 37 is a side elevational view, with a partial cut-away thereof, of a further illustrative electrical interface assembly of the present disclosure.

FIG. 37 shows a further illustrative signal interface assembly 512 having many similar features to the embodiments detailed above. As such, similar elements will be identified with like reference numbers. As with the signal interface assembly 412, the signal interface assembly 512 includes flexible side shields 514 configured to extend adjacent, and in laterally spaced relation to, the side wings 80. In certain embodiments, the flexible side shields 514 may replace the side wings 80. The side shields 514 may each comprise a flexible curtain 516 having a first end secured to the housing 48, and a second end coupled to the cover 76.

Each curtain 516 illustratively includes a plurality of foldable panels 518 supported between braces 520. The panels 518 are configured to collapse or fold in an accordion fashion. A releasable coupler, such as a hook and look fastener 522, illustratively secures the second end of the flexible curtain 516 to the cover 76. More particularly, a hook portion 524 may be secured to the cover 76, and a mating loop portion 526 may be secured to the curtain 516.

A retractor 528 is illustratively configured to fold the curtain 516. Retractor 528 may include a cord 530 supported on a rotatable spool 532. As the cord 530 is wound onto the spool 532, the second end of the curtain 516 is retracted and the curtain 516 folds or retracts inwardly. A drive mechanism (not shown) may be operably coupled to the spool 532 for imparting rotation thereof.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. An electrical interface assembly configured to be supported within a wall of a mobile structure, the electrical interface assembly comprising:
    a housing comprising a plurality of opposing walls comprising a top, bottom and two side walls, said plurality of walls enclose a cavity and have a first opening formed by a housing edge section of said walls;
    a frame including an outer support and an inner support spaced apart from the outer support, wherein said frame assembly is positioned within said housing and coupled to said walls of said housing, said outer support is recessed within said housing such that it is set back from said first opening;
    an exterior panel supported by the outer support and including at least one electrical connector;
    a first plurality of couplers removably coupling the exterior panel to the outer support;
    an outer electromagnetic interference gasket positioned intermediate the exterior panel and the outer support;
    an interior panel supported by the inner support and including at least one electrical connector;
    a second plurality of couplers removably coupling the interior panel to the inner support;
    an inner electromagnetic interference gasket positioned intermediate the interior panel and the inner support;
    a cable electrically coupled intermediate the at least one electrical connector of the exterior panel and the at least one electrical connector of the interior panel;
    at least one first hinge adapted to move about a first axis of rotation, wherein said first hinge further comprises a structure that includes a spring or lever detent structure which releasably locks said hinge assembly in a plurality of positions comprising a first and second position;
    a cover adapted to fit into said first opening in said housing with a gap of less than a quarter of an inch between an edge section of said housing's walls and said cover, said cover is pivotably coupled to the housing by said at least one first hinge;
    a plurality of second hinges, said hinge is spring loaded to apply a force to rotate said hinge around a second axis of rotation from a first position to a second position wherein said first and second axis of rotation are substantially orthogonal to each other;
    a first side wing pivotably coupled to a side wall of said housing by at least one said second hinge and a second side wing pivotably coupled to an opposing side wall of said housing in spaced relation to said first side wing, said first and second side wings comprise a substantially triangular and planar body extending between a first side and a second side with an apex at an upper end and a base at a lower end, the first side includes a substantially flat edge, while the second side includes an angled edge section, comprising a lip or flange extending away from the body, said base section includes a cut-out or notch defining opposing first and second sections of the body comprising a first tab section and second tab section, said notch is configured to provide clearance for a portion of the latching mechanism when the cover and the side wings are positioned to oriented towards each other within said housing; and
    a first latch positioned on a first section of said cover configured to releasably secure the cover to the first tab of said first side wing in a third position, said first coupler is also positioned and configured to releasably secure the cover to the lip or flange of said first side wing in proximity to said second tab on said second side of said first side wing in a fourth position, wherein said third position is a closed position that is substantially parallel to a plane defined by said first opening;
    wherein the outer frame includes an upper frame member coupled to a lower frame member, the upper frame member angled relative to the lower frame member.

2. The electrical interface assembly of claim 1, wherein the frame is adapted to be supported by a wall of a mobile shelter.

3. The electrical interface assembly of claim 2, wherein the frame includes a flange for mounting to the wall.

4. The electrical interface assembly of claim 1, wherein the exterior panel includes a plurality of electrical jacks.

5. The electrical interface assembly of claim 4, further comprising removable caps covering at least some of the electrical jacks.

6. The electrical interface assembly of claim 4, wherein the electrical connector is a telephone connector receptacle.

7. The electrical interface assembly of claim 4, wherein the interior panel includes a plurality of electrical connectors.

8. The electrical interface assembly of claim 7, wherein the electrical connectors include category 5 cable couplers.

9. A method of installing a signal entry panel, the method comprising the steps of:
providing a support including an outer support and an inner support spaced apart from the outer support, said support further comprising an upper section, a lower section, and first and second opposing side sections, wherein said opposing side sections are on opposite sides of said outer support and said upper section and lower section are above and below said outer support;
positioning an electromagnetic interference gasket adjacent the outer support;
positioning an outer signal entry panel adjacent the outer support with the electromagnetic interference gasket intermediate the signal entry panel and the outer support, the outer signal entry panel including at least one electrical connector;
securing a plurality of couplers to the signal entry panel for releasably coupling the signal entry panel to the outer support;
positioning an inner signal entry panel adjacent the inner support, the inner signal entry panel including at least one electrical connector;
electrically coupling the outer signal entry panel with the inner signal entry panel;
providing a cover adapted and sized to cover said outer support and outer signal entry panel;
providing at least one first hinge adapted to releasably lock and rotate round a first axis, said at least one first hinge is coupled to upper section of said support and to a first section of said cover;
providing a first and second side wing having a body formed into substantially a triangular shape and further comprising a base section opposing an apex of said triangular shape, said first side wing is coupled to said first opposing side section of said support with at least one spring loaded second hinge, said second side wing is coupled to said second opposing side section of said support with at least one said spring loaded second hinge, said base section of said first and second side wings further comprising a cut out section forming a first and second tab section on opposing side areas of said base section, said first tab is formed with substantially a planar form, said base section further comprises a flange which is in proximity to said second tab and extends away from a plane defined by said body; and
providing a first latch positioned on second section of said cover, said first latch is configured to releasably secure the cover to the first tab of said first side wing when said first side wing and said cover is in a first configuration, said first latch is also positioned and configured to releasably secure the cover to the flange of said first side wing when said second side wing and said cover are in a second configuration.

10. The method of claim 9, further comprising the steps of:
releasing a plurality of couplers from the outer signal entry panel;
removing the outer signal entry panel from the outer support;
positioning a substitute signal entry panel adjacent the outer support; and
securing the plurality of couplers to the substitute signal entry panel for releasably coupling the signal entry panel to the outer support.

11. The method of claim 9, wherein a chamber is defined between the outer support and the inner support, the chamber being positioned within the wall of a mobile structure.

12. The method of claim 11, wherein the step of electrically coupling includes extending a cable from between the outer signal entry panel and the inner signal entry panel through the chamber.

13. The method of claim 9, further comprising the step of electrically coupling external communication equipment to the at least one electrical connector of the outer signal entry panel.

14. The method of claim 13, further comprising the step of pivoting said cover upwardly to provide access to the outer signal entry panel.

15. The method of claim 9 wherein said second hinge is adapted to apply a rotational force around a second axis and position said first and second wings perpendicular to said cover when said cover is in said first position.

16. The method of claim 10, further comprising providing a second latch positioned on a third section of said cover, said second latch is configured to releasably secure the cover to the first tab of said first side wing when said first side wing and said cover is in said first configuration, said second latch is also positioned and configured to releasably secure the cover to the flange of said second side wing when said second side wing and said cover are in said second configuration.

17. The electrical interface assembly of claim 1, wherein said substantially triangular and planar body of said first and second side wings is substantially formed in an acute triangle shape.

18. The electrical interface assembly of claim 1, wherein said substantially triangular and planar body of said first and second side wings is substantially formed in an obtuse triangle shape.

19. The electrical interface assembly of claim 1, wherein the outer frame further includes a deflector planar section adapted to convey water or contaminants incident on said deflector away from said lower frame towards said first opening and is operably coupled below the lower frame member and is angled relative thereto, said deflector planar section extends down to said bottom wall and terminates in substantially close proximity to said housing edge section formed by said bottom wall.

20. The electrical interface assembly of claim 1, a second coupler positioned on a second section of said cover configured to releasably secure the cover to the first tab of said second side wing in said third position, said first coupler is also positioned and configured to releasably secure the cover to the lip or flange of said second side wing in proximity to said second tab on said second side of said second side wing in said fourth position.

* * * * *